(12) United States Patent
Milanovic et al.

(10) Patent No.: US 7,295,726 B1
(45) Date of Patent: Nov. 13, 2007

(54) GIMBAL-LESS MICRO-ELECTRO-MECHANICAL-SYSTEM TIP-TILT AND TIP-TILT-PISTON ACTUATORS AND A METHOD FOR FORMING THE SAME

(75) Inventors: Veljko Milanovic, Berkeley, CA (US); Gabriel A. Matus, Santa Clara, CA (US)

(73) Assignee: Adriatic Research Institute, Berkeley, CA (US)

( * ) Notice: Subject to any disclaimer, the term of this patent is extended or adjusted under 35 U.S.C. 154(b) by 49 days.

(21) Appl. No.: 11/003,271

(22) Filed: Dec. 2, 2004

Related U.S. Application Data

(60) Provisional application No. 60/526,510, filed on Dec. 2, 2003.

(51) Int. Cl.
*G02B 6/26* (2006.01)
*G02B 6/35* (2006.01)

(52) U.S. Cl. .................... 385/18; 385/16; 385/17; 385/14

(58) Field of Classification Search .............. 385/18; 359/212–214, 196
See application file for complete search history.

(56) References Cited

U.S. PATENT DOCUMENTS

| | | | |
|---|---|---|---|
| 4,662,746 A | 5/1987 | Hornbeck | 359/223 |
| 4,710,732 A | 12/1987 | Hornbeck | 359/291 |
| 4,956,619 A | 9/1990 | Hornbeck | 359/317 |
| 5,061,049 A | 10/1991 | Hornbeck | 359/224 |
| 5,079,545 A | 1/1992 | Priem | 345/628 |
| 5,083,857 A | 1/1992 | Hornbeck | 359/291 |
| 5,105,369 A | 4/1992 | Nelson | 250/201.4 |
| 5,172,262 A | 12/1992 | Hornbeck | 359/223 |
| 5,278,652 A | 1/1994 | Urbanus | 348/571 |
| 5,469,302 A | 11/1995 | Lim | 359/846 |
| 5,535,047 A | 7/1996 | Hornbeck | 395/295 |
| 5,661,591 A | 8/1997 | Lin et al. | 359/290 |
| 6,480,320 B2 | 11/2002 | Nasiri | 359/291 |

(Continued)

OTHER PUBLICATIONS

D. H. Hah, et al, "Theory and Experiments of Angular Vertical Comb-Drive Actuators for Scanning Micromirrors", IEEE Journal of Selected Topics in Quantum Electronics, vol. 10, No. 3, May/Jun. 2004, p. 505-513.

(Continued)

*Primary Examiner*—Michelle R. Connelly-Cushwa
(74) *Attorney, Agent, or Firm*—Joshua D. Isenberg; JDI Patent

(57) ABSTRACT

Fully monolithic gimbal-less micro-electro-mechanical-system (MEMS) devices with large static optical beam deflection and fabrications methods are disclosed. The devices can achieve high speed of operation for both axes. Actuators are connected to a device, or device mount by linkages that allow static two-axis rotation in addition to pistoning without the need for gimbals, or specialized isolation technologies. The device may be actuated by vertical comb-drive actuators, which are coupled by bi-axial flexures to a central micromirror or device mount. Devices may be fabricated by etching an upper layer both from the top side and from the bottom side to form beams at different levels, The beams include a plurality of lower beams, a plurality of full-thickness beams, and a plurality of upper beams, the lower, full-thickness and upper beams That form vertical comb-drive actuators, suspension beams, flexures, and a device mount.

14 Claims, 25 Drawing Sheets

U.S. PATENT DOCUMENTS

| | | | |
|---|---|---|---|
| 6,593,677 B2 * | 7/2003 | Behin et al. | 310/309 |
| 6,822,776 B2 * | 11/2004 | Hah et al. | 359/224 |
| 6,865,313 B2 * | 3/2005 | Mao et al. | 385/18 |
| 2002/0071169 A1 | 6/2002 | Bowers | 359/291 |
| 2002/0075554 A1 | 6/2002 | Brophy | 359/291 |
| 2004/0081391 A1 * | 4/2004 | Ko et al. | 385/18 |
| 2004/0252936 A1 * | 12/2004 | Despont et al. | 385/18 |
| 2005/0018322 A1 * | 1/2005 | Ben-Gad et al. | 359/846 |

OTHER PUBLICATIONS

V. Milanović, et al., "Monolithic Silicon Micromirrors with Large Scanning Angle," *Optical MEMS'01*, Okinawa, Japan, Sep. 2001.

R. Conant, et al., "A Flat High-Frequency Scanning Micromirror," *Proc. Solid-State Sensor and Actuator Workshop*, Hilton Head, South Carolina, pp. 6-9, Jun. 4-8, 2000.

J. T. Nee, et al, "Lightweight, optically flat micromirrors for fast beaming steering," 2000 IEEE/LEOS Int. Conference on Optical MEMS, Kauai, HI, Aug. 21-24, 2000, p. 9-10.

U. Krishnamoorthy, O. Solgaard, "Self-Aligned Vertical Combdrive Actuators for Optical Scanning Micromirrors," 2000 IEEE/LEOS International Conference on Optical MEMS, Okinawa, Japan, Sep. 2001.

V. Milanović, "Multilevel-Beam SOI-MEMS Fabrication and Applications," J. of Microelectromechanical Systems, vol. 13, No. 1, pp. 19-30, Feb. 2004.

V. Milanović, S. Kwon, L. P. Lee, "Monolithic Vertical Combdrive Actuators for Adaptive Optics," IEEE/LEOS Int. Conference on Optical MEMS, Switzerland, Aug. 2002.

S. Kwon, V. Milanović, L. P. Lee, "Vertical Microlens Scanner for 3D Imaging," *Proc. Solid-State Sensor and Actuator Workshop*, Hilton Head, South Carolina, Jun. 2002.

S. Kwon, V. Milanović, L. P. Lee, "A High Aspect Ratio 2D Gimbaled Microscanner with Large Static Rotation," IEEE/LEOS Int. Conf. on Optical MEMS'02, Switzerland, Aug. 2002.

H. Schenk, et al, "Large Deflection Micromechanical Scanning Mirrors for Linear Scans and Pattern Generation," IEEE J. of Selected Topics in Quantum Electronics, vol. 6, No. 5, Sep./Oct. 2000.

T. Brosnihan, et al, "Embedded Interconnect and Electrical Isolation for High-Aspect-Ratio, SOI Inertial Instruments," Proceedings of the 1997 Int. Conf. on Solid-State Sensors and Actuators, Chicago, Jun. 16-19, 1997, p. 637-640.

V. Milanović, G. Matus, T. Cheng, B. Cagdasar, "Monolithic High Aspect Ratio Two-axis Optical Scanner in SOI," Int. Conf. on Microelectromechanical Systems, MEMS2003, Kyoto, Japan, pp. 255-258, Jan. 2003.

F. Niklaus, S. Haasl and G. Stemme, "Arrays of monocrystalline silicon micromirrors fabricated using CMOS compatible transfer bonding," J. of MEMS, v 12, n 4, Aug. 2003, p. 465-469.

U. Srinivasan, et al, "Fluidic self-assembly of micromirrors onto microactuators using capillary forces," IEEE J. of Spec. Topics in Quantum Electronics, vol. 8 (1), pp. 4-11, Jan. 2002.

C. Rembe, et al, "Stroboscopic interferometer with variable magnification to measure dynamics in an adaptive-optics micromirror," 2000 IEEE/LEOS Int. Conf. on Optical MEMS, Aug. 21-24, 2000.

J.-C. Tsai, et al, "Analog Micromirror Arrays with Orthogonal Scanning Directions for Wavelength Selective 1xN2 Switches," Transducers '03, pp. 1776-1779, Jun. 2003.

J.-L. A. Yeh, et al, "Electrostatic Model for an Asymmetric Combdrive", *J. of MEMS*, vol. 9, No. 1, Mar. 2000.

Jin-Ho Lee et al "Fabrication of silicon optical scanner for laser display," 2000 IEEE/LEOS International Conference on Optical MEMS, Kauai, HI, Aug. 21-24, 2000, p. 13-14.

J. M.-L. Tsai, H.-Y. Chu, J. Hsieh, and W. Fang, "The BELST II process for a silicon high-aspect-ratio micromaching vertical comb actuator and its applications," J. Micromechanics and Microengineering 14, pp. 235-241, Nov. 2003.

V. Milanović, S. Kwon, L. P. Lee, "High Aspect Ratio Micromirrors With Large Static Rotation and Piston Actuation", IEEE Photonics Technology Letters, vol. 16, No. 8, Aug. 2004, p. 1891-1893.

"MEMS Precision Instruments" downloaded from Internet, downloaded from <http://www.memspi.com> on Mar. 1, 2006.

V. Milanović, "Multilevel-Beam SOI-MEMS for Optical Applications," *Proc. 9th IEEE Int. Conf. on Electronics, Circuits and Systems—ICECS'02*, Dubrovnik, Croatia, Sep. 2002. pp. 281-285.

D. Hah, et al, "A Self-Aligned Vertical Comb-Drive Actuator on an SOI Wafer for a 2D Scanning Micromirror", Institute of Physics Publishing, Journal of Micromechanics and Microengineering, vol. 14, 2004, p. 1148-1156.

* cited by examiner

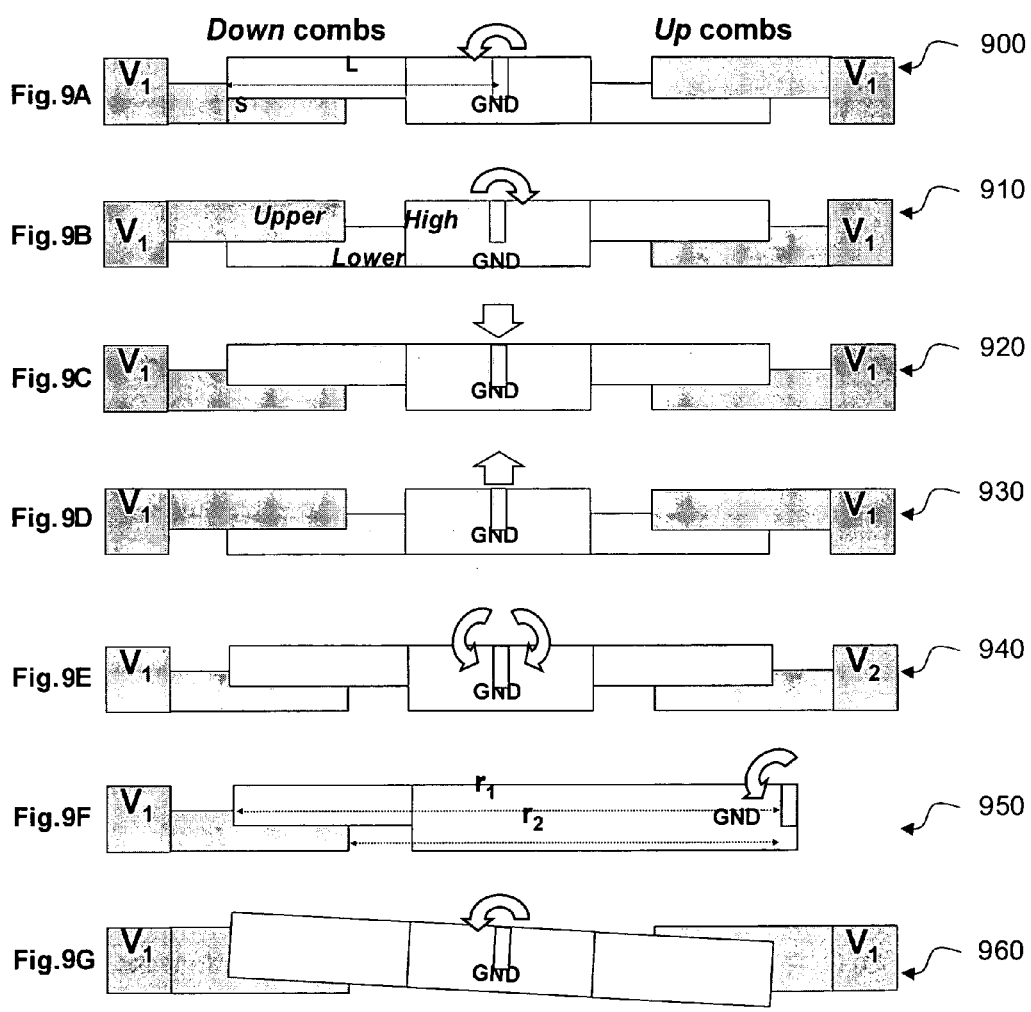

☐ Cavity ☐ Lower ■ Upper ■ Full

☐ Cavity ☐ Lower ■ Upper ■ Full

☐ Cavity  ☐ Lower  ■ Upper  ■ Full

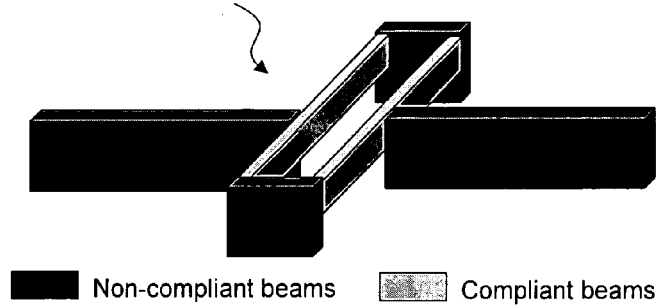
Fig.23A
■ Non-compliant beams    ▨ Compliant beams
Fig.23B
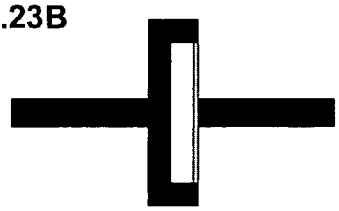
Fig.23C
Fig.23D
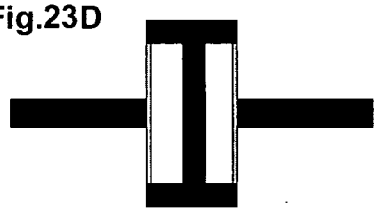
Fig.23E
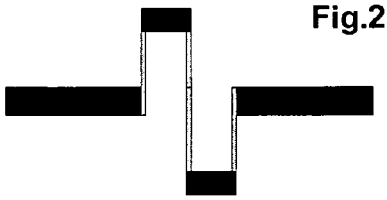
Fig.23F
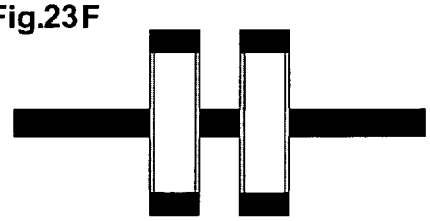
Fig.23G
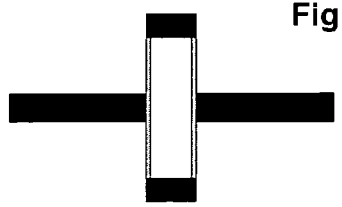

■ Non-compliant beams  ▨ Compliant beams  ☐ 1st DoF rotation  ■ 2nd DoF rotation

GIMBAL-LESS MICRO-ELECTRO-MECHANICAL-SYSTEM TIP-TILT AND TIP-TILT-PISTON ACTUATORS AND A METHOD FOR FORMING THE SAME

CROSS-REFERENCE TO RELATED APPLICATION

This application claims the benefit of prior U.S. provisional application No. 60/526,510 filed Dec. 2, 2003, the entire disclosures of which are incorporated herein by reference.

FIELD OF THE INVENTION

Embodiments of the present invention relate to micro-electro-mechanical-system (MEMS) two-dimensional (tip-tilt) actuator or a three dimensional (tip-tilt-piston) actuator with articulated suspension structures for high fill factor arrays.

BACKGROUND OF THE INVENTION

A MEMS (Micro-Electro-Mechanical-System) device is a micro-sized mechanical structure having electrical circuitry fabricated together with the device by various microfabrication processes mostly derived from integrated circuit fabrication methods. The developments in the field of microelectromechanical systems (MEMS) allow for the bulk production of microelectromechanical mirrors and mirror arrays that can be used in all-optical cross connect switches, 1×N, N×N optical switches, attenuators etc. A number of microelectromechanical mirror arrays have already been built using MEMS production processes and techniques. These arrays have designs that fall into approximately three design categories. A desirable component of many MEMS devices is an actuator that provides for either tip-tilt (2 degrees of freedom) or tip-tilt-piston (3 degrees of freedom) actuation.

Utilizing gimbaled structures is the most common method of implementing two-axis (two degrees of freedom, 2 DoF) rotation, although packaging-based methods are utilized as well. However, to implement 2 DoF gimbaled micromirrors without cross talk between driving voltages, electrical isolation and mechanical coupling is necessary. Backfilling of isolation trenches by depositing an additional dielectric layer and chemical mechanical polishing (CMP) has been used to achieve the electrically isolated mechanical coupling. However, the additional deposition and CMP steps significantly increase complexity and cost. Another viable method is to leave part of the handle wafer unetched beneath the gimbal structure. In all cases, complex fabrication has been required, and relatively low frequencies have been achieved due to the gimbals' slow outer axis. In applications where high speed static scanning is required the previous methods do not provide adequate solutions.

SUMMARY OF THE INVENTION

Embodiments of the invention are directed to micro-electro-mechanical system (MEMS) devices and methods for their fabrication.

According to an embodiment of the invention a micro-electro-mechanical-system (MEMS) device includes a gimbal-less device mount supported by two or more bi-axial linkages mechanically coupled between the device mount and an actuator. The bi-axial linkages and device mount are formed from the same device layer. Each bi-axial linkage includes a first flexure beam configured to flex about a first axis and a second flexure beam attached to the first flexure beam. The second flexure beam is configured to flex about a second axis. The first axis is non-parallel to the second axis. The bi-axial linkages provide the device mount with two or more degrees of freedom of movement. An optical component, such as a mirror may be attached to the device mount.

One or more actuators may be arranged in such a pattern that one end of each actuator abuts a side of a neighboring actuator proximate the device mount and another end of each actuator may extend away from the device mount without abutting a neighboring actuator in the device.

A second embodiment of the invention includes methods for fabricating a micro-electro-mechanical system (MEMS). According to embodiments of the method a substrate is prepared including an upper layer. The upper layer is etched both from a top side and from a bottom side to form beams at different levels. The beams include a plurality of lower beams, a plurality of full-thickness beams, and a plurality of upper beams. The lower, full-thickness and upper beams form vertical combdrive actuators, suspension beams, flexures, and a device mount.

The substrate may be prepared by double-side-polishing a first wafer to form a lower layer and single- or double-side polishing a second wafer to form the upper layer. A wet thermal oxide may then be grown on one or both of the first and second wafers to form an oxide layer. The upper layer may be patterned with a photoresist and/or oxide mask and a surface of the upper layer may be etched to a depth of less than one half of a final desired upper layer thickness. After removing the mask from the upper layer, the first and second wafers may be bonded to form a bonded substrate with the etched surface of the upper layer facing a polished surface of the lower layer.

Other objects and advantages of the present invention will become apparent from the following description and accompanying drawings.

BRIEF DESCRIPTION OF THE DRAWINGS

Preferred embodiments of the invention will now be described with reference to the attached drawings in which:

FIG. 9 is a series of cross-sectional diagrams depicting many combinations of vertical combdrive actuators as a result of the described fabrication steps according to embodiments of the invention.

FIG. 9A and FIG. 9B are cross-sectional diagrams of balanced rotators with opposing rotation directions, respectively.

FIG. 9C and FIG. 9D are cross-sectional diagrams of vertical pistoning actuators with opposing pistoning directions, respectively.

FIG. 9E is a cross-sectional diagram of a bi-directional rotator with opposing pistoning directions, respectively.

FIG. 9F is a cross-sectional diagram depicting a single-sided rotator where the rotational axis has been displaced further from the combdrive fingers to achieving greater torque.

FIG. 9G is a cross-sectional diagram of a balanced rotator which has driving force always in the direction of the zero angle.

FIG. 23A is a 3D schematic of a 1 DoF linkage that can be micromachined from a single monolithic piece of substrate.

FIG. 23B-G is a series of plan view schematics of various possible 1 DoF linkages that can be micromachined from a single monolithic piece of substrate.

DETAILED DESCRIPTION OF THE PREFERRED EMBODIMENTS

Figure 1:
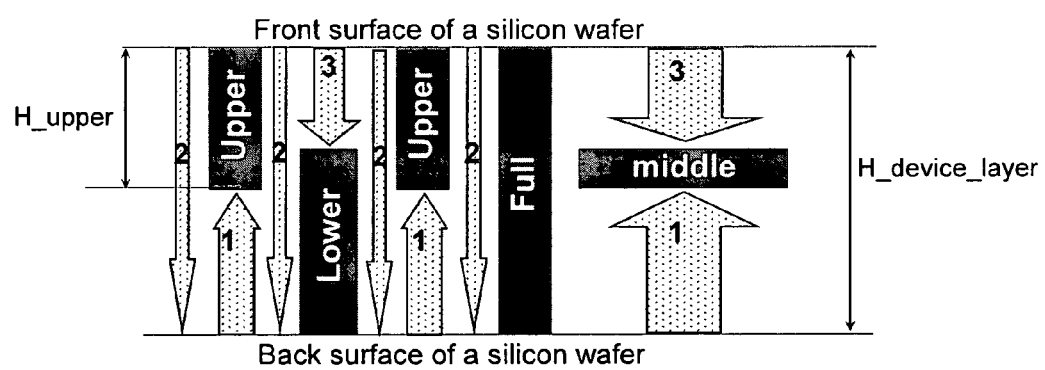
FIG. 1 provides a cross-sectional schematic diagram of possible structural layers in a micromachined monolithic substrate.

Embodiments of the present invention utilize a combination of one-axis vertical comb-drive based rotation actuators and bi-axial mechanical linkages that allow 2 DoF of rotation (tip-tilt,) or 3 DoF of motion (tip-tilt-piston) for a central structural support for an optical element such as a micromirror. The comb-drive actuators can by themselves achieve >20° of static optical deflection at frequencies of up to several kHz (with a 600 µm diameter and 30 µm thick silicon micromirror attached to the support). Such a configuration can effectively decouple the problem of two-axis scanners and can independently optimize and approach the problem of improving one-axis rotators, as well as the linkages that form the overall 2 DoF structure. While many embodiments described herein use comb-drive rotators to produce the actuation of the central support, the design can also utilize pure vertical actuators, gap-closing electrodes or piston actuators.

In order to achieve the goal of large optical phased arrays with high fill factor (e.g. >96%,) it is desirable to completely cover the actuators beneath the optical component (e.g., a micromirror's reflecting plate) for high fill-factor, therefore additional fabrication/packaging solutions are required. In one embodiment low-inertia silicon micromirrors are separately fabricated and transferred/bonded into place on top of the central support. The actuators must be reduced in size significantly to fit beneath a mirror with an edge dimension of less than 800 µm, while maintaining large torque and therefore high-speed operation.

Presently, structures made of the single crystal silicon (SCS) are very common in MEMS. Although the single crystal silicon is a brittle material, the flexibility of the structure is significantly increased owing to fact that the MEMS structure's volume is extremely small. Other than that, the mechanical strength of the MEMS structure is higher than that of most metals and alloys. The MEMS structure does not only not have the problem of thin film stress, but also has a smaller signal shift induced by temperature due the fact that it has a thermal expansion coefficient smaller than that of a metal. In addition, the manufactured thick structure owns many advantages including a higher driving frequency, a smaller dynamic distortion of the structure, a smaller effect from the out-of-plane perturbation motion, and a larger range of the structural rigidity.

Vertically staggered SOI comb drives perform well for single-sided rotation applications and demonstrate the numerous advantages of SOI-microelectromechanical systems (MEMS) for optical applications. However, in previous processes, no isolation was available between comb-drive fingers in either upper or lower comb drives, limiting devices to one-sided rotation. Rotation of devices is accompanied by undesired downward and lateral actuation due to the net electrostatic force, which is undesirable for many applications. Also, the support beams are full-thickness SOI device layer beams which are stiff for torsion-rotation and especially inadequate for pistoning. Lastly, the upper and lower comb finger sets are separated by the thickness of insulating oxide ~1 µm, sometimes requiring large biasing (pre-tilting) of devices before the comb fingers are adequately engaged. Pre-engagement of vertical comb fingers is desirable for well-behaved performance at lower actuation voltages. This was previously demonstrated in a silicon optical scanner fabricated by eutectic bonding assembly, as well as in the electrostatic vertical comb actuator fabricated in the BELST II process. Eutectic bonding assembly suffers from difficult alignment between comb fingers and utilizes metals and alloys that can reduce repeatability and reliability of device operation. Devices fabricated by the BELST II process have relatively large spacing between successive comb fingers due to the need for specialized processing of the lower, stationary fingers and, therefore, reduced torque. In addition, release holes must be properly placed in the design, increasing design complexity and compromising the mirror's reflecting surface.

Gimbal-less actuators according to embodiments of the present invention may be fabricated using a three-mask process or a four-mask process that alleviates the above limitations, allowing various comb finger arrangements, e.g., as depicted in the schematic cross sections of FIG. 9. All comb fingers in the actuators are fabricated in the device layer allowing isolated independently powered vertical comb-drive sets. This enables independent up or down pistoning and bi-directional rotation, which can be combined to achieve pure rotation, i.e. rotation with no lateral or vertical motion of the shuttle. The comb fingers of the actuators are fabricated by a timed etch such that there are several microns of pre-engagement (overlap) between the comb fingers, giving significantly better performance at lower voltages. Support beams can be of any desired thickness for lower-voltage operation, and optimized rotation versus pistoning compliance. Masks for etching of comb fingers are self-aligned by a single mask before any deep reactive ion etching (DRIE) steps. The actuator structures may be made from monolithic single-crystal silicon for repeatable and reliable operation. The process is described in detail by V. Milanovic in "Multilevel-beam SOI-MEMS fabrication and applications," *J. Microelectromech. Syst.*, vol. 13, no. 1, pp. 19-30, February 2004, which is incorporated herein by reference and will be summarized herein.

The basis of the fabrication methodology is that a monolithic substrate of single crystal silicon (or similar material, SiGe or SiC, polysilicon, metallic depositable materials, etc.), e.g. a single-crystal silicon wafer with double-side polished front- and back-side, can be etched from the front-side and from the back-side in an aligned fashion to form three-dimensional electro-mechanical structures. Particularly, as shown in FIG. 1, by utilizing 3 etches (labeled in FIG. 1 as arrows 1, 2, 3) one can obtain 4 distinct types of mechanical structures: Upper, Lower, Middle, and Full beams (all shown in the cross-sectional diagram of FIG. 1)

Figure 2A:
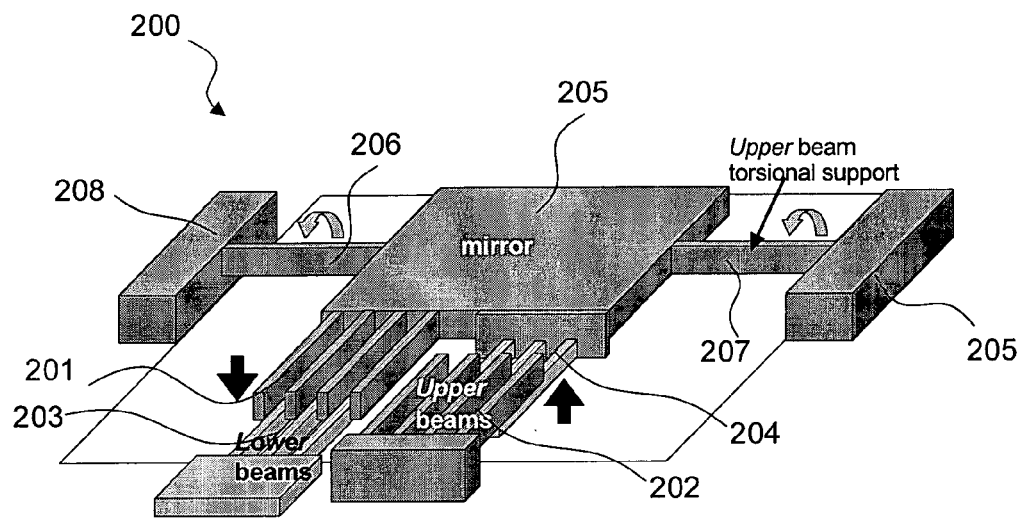
FIG. 2A shows a 3D schematic of a device that features up and down actuators and a mirror in the same rotator according to an embodiment of the invention.
Figure 2B:
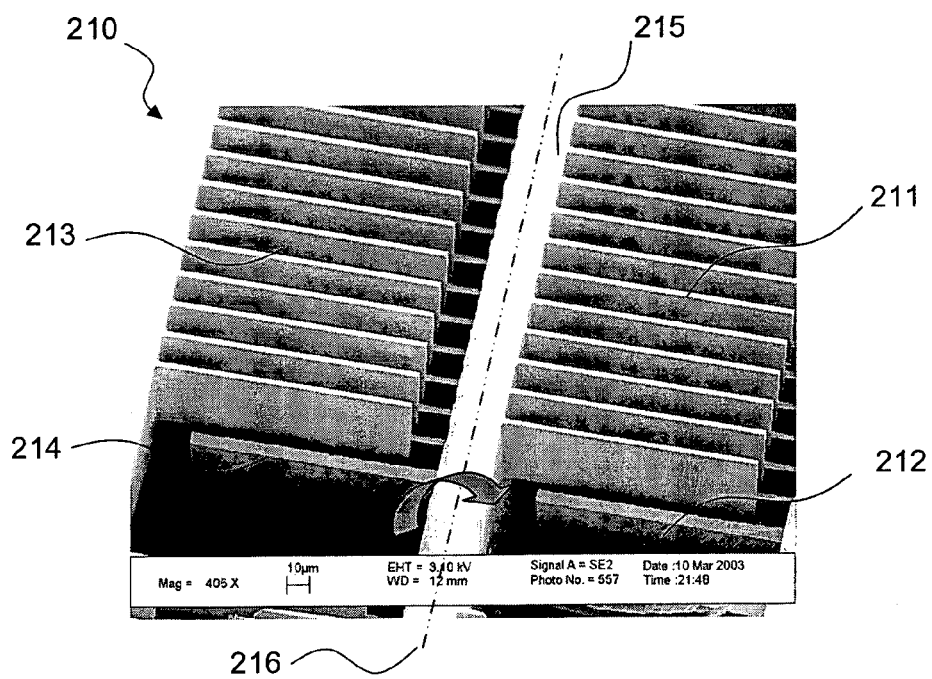
FIG. 2B is a SEM micrograph of a balanced rotator according to an embodiment of the invention.

By carefully aligning the 3 etches by utilizing self-alignment techniques and front-to-back alignment, very useful structure of interdigitated vertical combdrives shown in FIG. 2 is achieved. Since etch #2 in FIG. 1 etches through the substrate, isolated regions of the electrically conductive substrate which can act as electrostatic electrodes. Etches #1 and #3 are usually timed in such as fashion that Lower and Upper fingers have overlap (pre-engagement,) and the resulting combdrives have highly desired properties such as substantially linear force vs. position relationship throughout its stroke.

Also as shown in FIG. 2, various arrangements of upper beams 201, 202 and lower beams 203, 204 produce combdrives that provide downward force or upward force. The upper diagram indicated at (a) of FIG. 2 depicts a device 200 where both combdrives are utilized side by side such that one combdrive or the other can be actuated and thereby achieve bi-directional rotation of an optical component such as a mirror 205 that is connected by flexure beams 206, 207 to anchors 208, 209. The mirror 205 is connected to a common potential (e.g. GND) while one static end of each combdrive as the counter-electrode. The mirror 205 may be made of silicon and plated with a metal such as gold, copper, aluminum or chrome or any combination thereof.

The lower portion of FIG. 2, indicated at (b) is a SEM micrograph of a balanced rotator device 210 with the preferred arrangement of combdrives to achieve substantially pure rotation. A shuttle 215 is suspended by two torsional supports not seen in the figure and can be moved by electrostatic forces on the combdrives. Combfinger sets 211 and 214 are attached to the shuttle 215 and are therefore moving combfingers. Combfinger sets 212 and 213 are fixed combfingers. The combdrive made of combfingers 211 and 212 is therefore a downward-force combdrive. The combdrive made of combfingers 213 and 214 is therefore an upward-force combdrive. By combining a downward force combdrive with an upward force combdrive on opposite sides of the rotation axis 216 (axial to the shuttle 215), and actuating both simultaneously, lateral and vertical translational forces are substantially cancelled. However, the torque from each side is combined in the same direction of rotation (clockwise for device 210 as shown in FIG. 2)

As stated above, the fabrication typically requires four photolithography masks-three for the desired three-level beams (upper, lower, and full) as shown in FIG. 1 and FIG. 9, and one for the bulk backside etch. The latter Backside mask provides dry release for devices in the SOI device layer, as well as space for rotation and vertical displacement of structures and integrated micromirrors. For that reason, the Backside mask is not necessary for small tip-tilt-piston array elements with micromirrors bonded to a device support, with minor modifications to the rest of the process.

Figure 3:
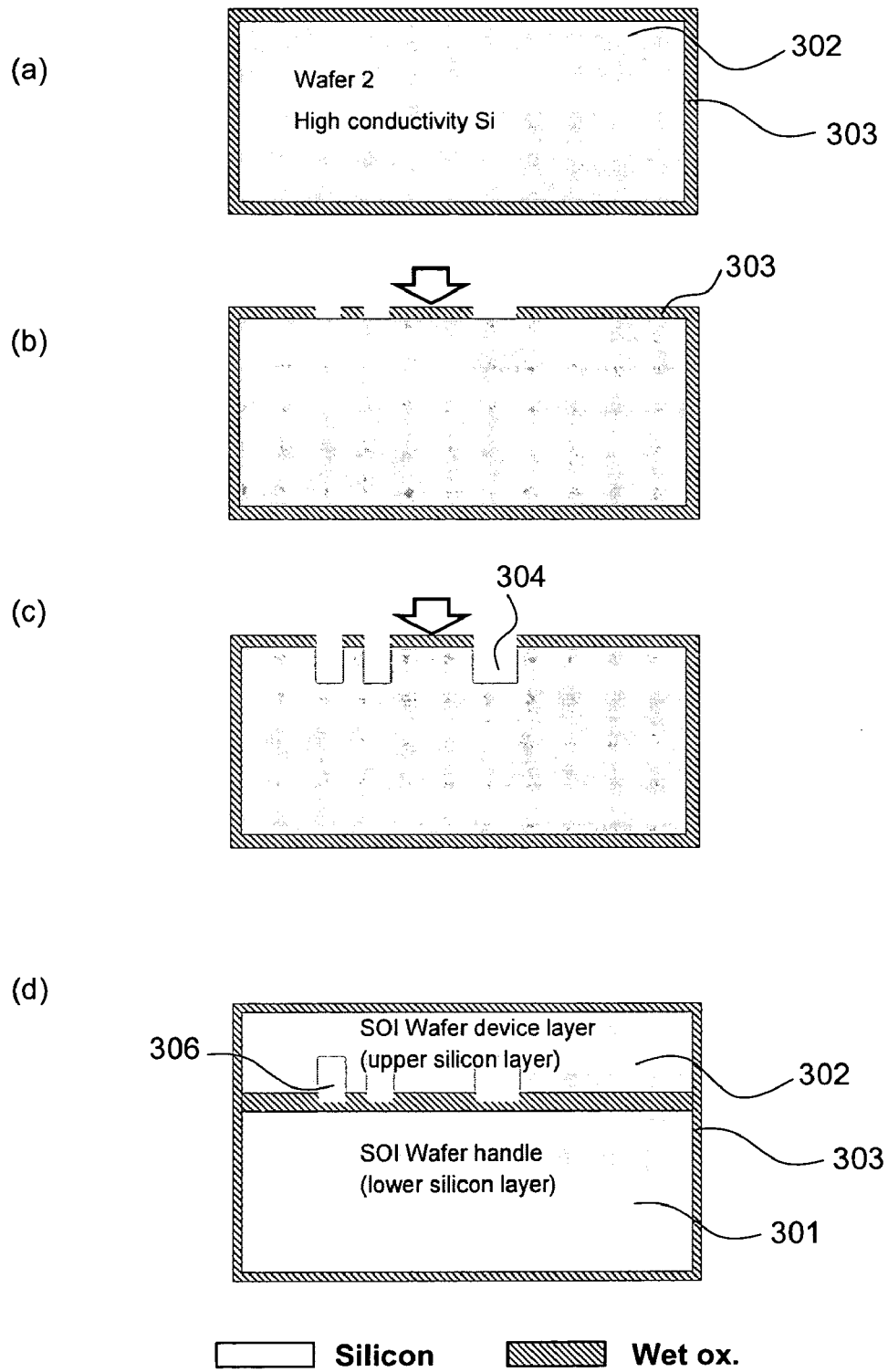
FIG. 3 is a sequence of cross-sectional diagrams that illustrates the preparation of the silicon on insulator (SOI) wafer with a buried etched pattern.

1) SOI Wafer Preparation as depicted in FIG. 3: The process begins by fabricating the SOI wafers, which may be 4 inches in diameter. As indicated at (a), a first wafer 301, intended for the SOI handle, is double-side-polished with a thickness of 300±1 µm. As indicated at (b), a second wafer 302, which is to become the device layer, is a n-type wafer, standard thickness 525±25 µm, and single-side polished. A wet thermal oxide 303 approximately 1 µm thick is grown on both wafers 301, 302. The oxide 303 on a side of the second wafer 302 that is intended for bonding is patterned before the bonding. The patterned side of the second wafer 302 becomes, in effect, the backside. Specifically, as indicated at (b) after the thermal oxide 303 is grown on both wafers 301, 302, the second wafer 302 is patterned with a backup mask and the oxide is etched down to expose portions of the second wafer 302 and (optionally) form trenches 304 and/or alignment features. After removing the photoresist mask and thorough cleaning, the wafers 301, 302 are prebonded, annealed, and sent for grinding and polishing to desired device layer thickness to form a finished SOI wafer 400. As a result of the patterned etching of the backside of the second wafer 302, a backup mask 306 is formed buried within the SOI wafer 400.

In above SOI preparation step, it should be noted that the lower silicon layer or the SOI handle (first wafer 301) performs as the holding/handling substrate for the micromachined structure as shown in FIG. 1 and may not have any electromechanical functionality in the device. Therefore, the first wafer 301 may be another material, including quartz or pyrex which would also provide significantly lower parasitic capacitances.

Figure 4:
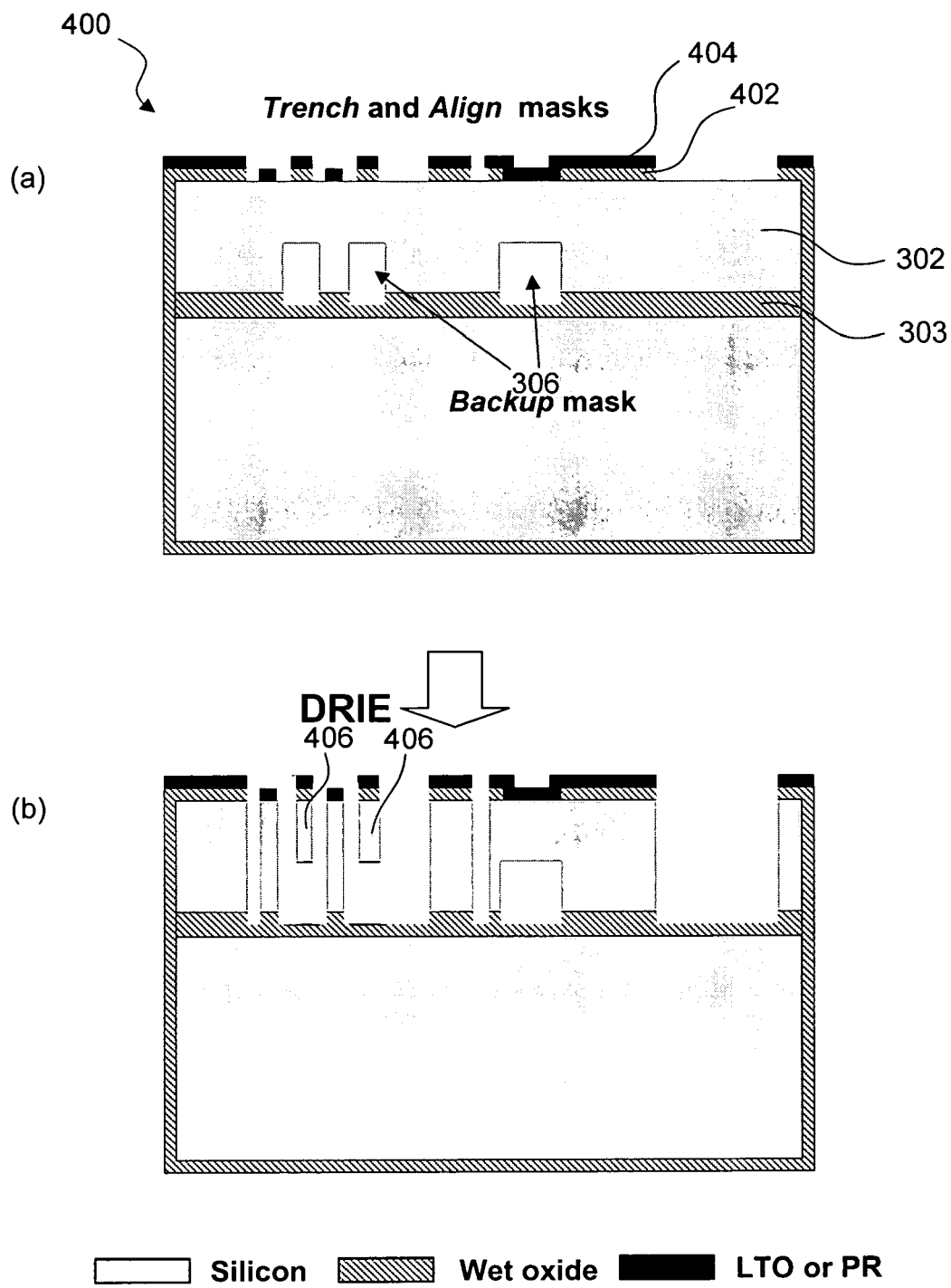
FIG. 4 and FIG. 5 is a sequence of cross-sectional diagrams depicting fabrication steps for the micromachining of the upper silicon layer of the SOI wafer.

2) Mask Preparation and Self-Alignment Methodology as depicted in FIG. 4: On the finished SOI wafer 400, first and second front-side masks 402, 404 are prepared utilizing oxides of two thicknesses, or as indicated at (a), a combination of an oxide and photoresist (PR). The mask preparation is arranged to provide self-alignment of both front-side masks for high-performance vertical comb drives. Specifically, the second front-side mask 404 (LTO or PR in FIG. 4) is used to etch back the previously slightly overgrown first front-side mask 402 (e.g., oxide), such that all final features are provided by a single and final mask. In addition, due to the fact that the backup mask 306 that is already buried within the SOI wafer 400, the mask preparation process requires that both of the front-side masks 402, 404 be aligned to the buried backup mask 306. This can be achieved by micromachining (partially or fully to the oxide layer 303) the front-side of the wafer 302 on a test die on each side of the wafer, such as to expose the buried backup mask 306 and its alignment features. All subsequent masks can therefore be aligned to the exposed features.

4) Front-Side DRIE: The front-side deep reactive ion etch (DRIE) steps are shown in the lower portion of FIG. 4 (indicated at (b)) and in FIG. 5 to better understand the formation of vertical comb drives. First. DRIE etches partially to a certain depth or all the way through the device layer (i.e., second wafer 302) to the buried oxide layer 303 as shown at (b) of FIG. 4 forming a set of upper beams 406 over the trenches 304 that were formed as part of the backup mask 306. Then, the mask that was applied last (second mask 404, which can be LTO or PR) is removed. If oxide mask was used as the second mask 404, an oxide plasma etch of ~0.8 µm on the front side thins down the oxide everywhere, removing the thinner oxide mask (as indicated at (a) of FIG. 5). If photoresist is used, it is simply stripped and the SOI wafer 400 is cleaned. The second and final front-side DRIE is performed until the devices are done, i.e., until lower beams 408 are lowered to a desired height (e.g. 30 µm) as shown in schematic at (b) of FIG. 5.

Figure 13A:
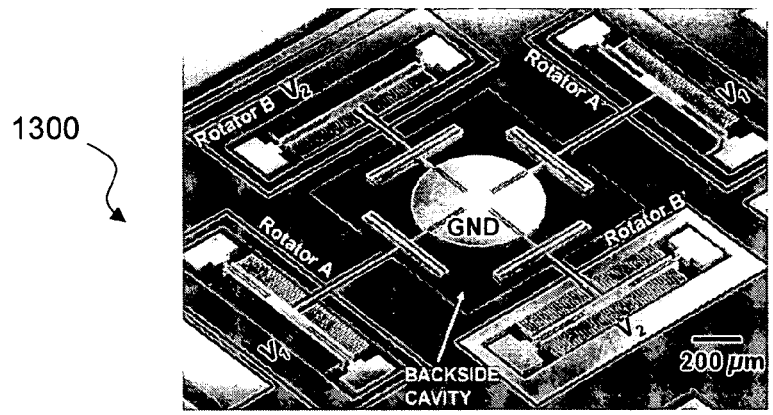
FIG. 13A is an SEM micrograph of an embodiment of the invention using four rotators which surround the micromirror on four sides, to scan in two axes.
Figure 13B:
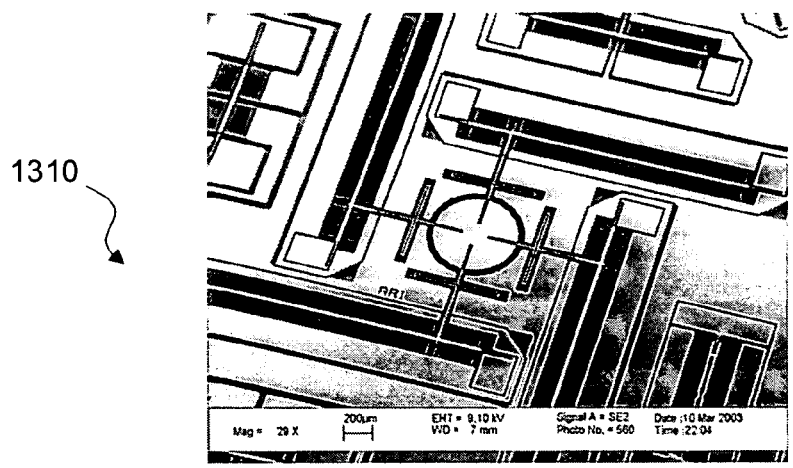
FIG. 13B is an SEM micrograph of an embodiment of the invention with an arrangement of rotators in such a way that they may extend to any desired length without crossing.

As mentioned above, the lower silicon layer 301 of the SOI handle wafer 400 does not provide electromechanical functionality as do the structures in the upper silicon layer 302. However, in many embodiments of the invention, the mechanical structures require large space above and below to freely achieve out-of-plane motion, e.g. micromirror rotation. For example, devices 1300, 1310, 1320 depicted in FIG. 13A, FIG. 13B and FIG. 13C respectively and device 1400 in FIG. 14A all have integrated mirror plates as part of a micromachined upper layer structure. These micromirrors are large in diameter such that their rotation requires a large cavity below and above. In such cases, as well as in cases where we desire for combdrives to be fully suspended over an air cavity, we require micromachining of the lower silicon layer. Detailed description of the processes and variations is given by V. Milanovic in "Multilevel-beam SOI-MEMS fabrication and applications," *J. Microelectromech. Syst.*, vol. 13, no. 1, pp. 19-30, February 2004, which is incorporated herein by reference and will be summarized herein.

Figure 5:
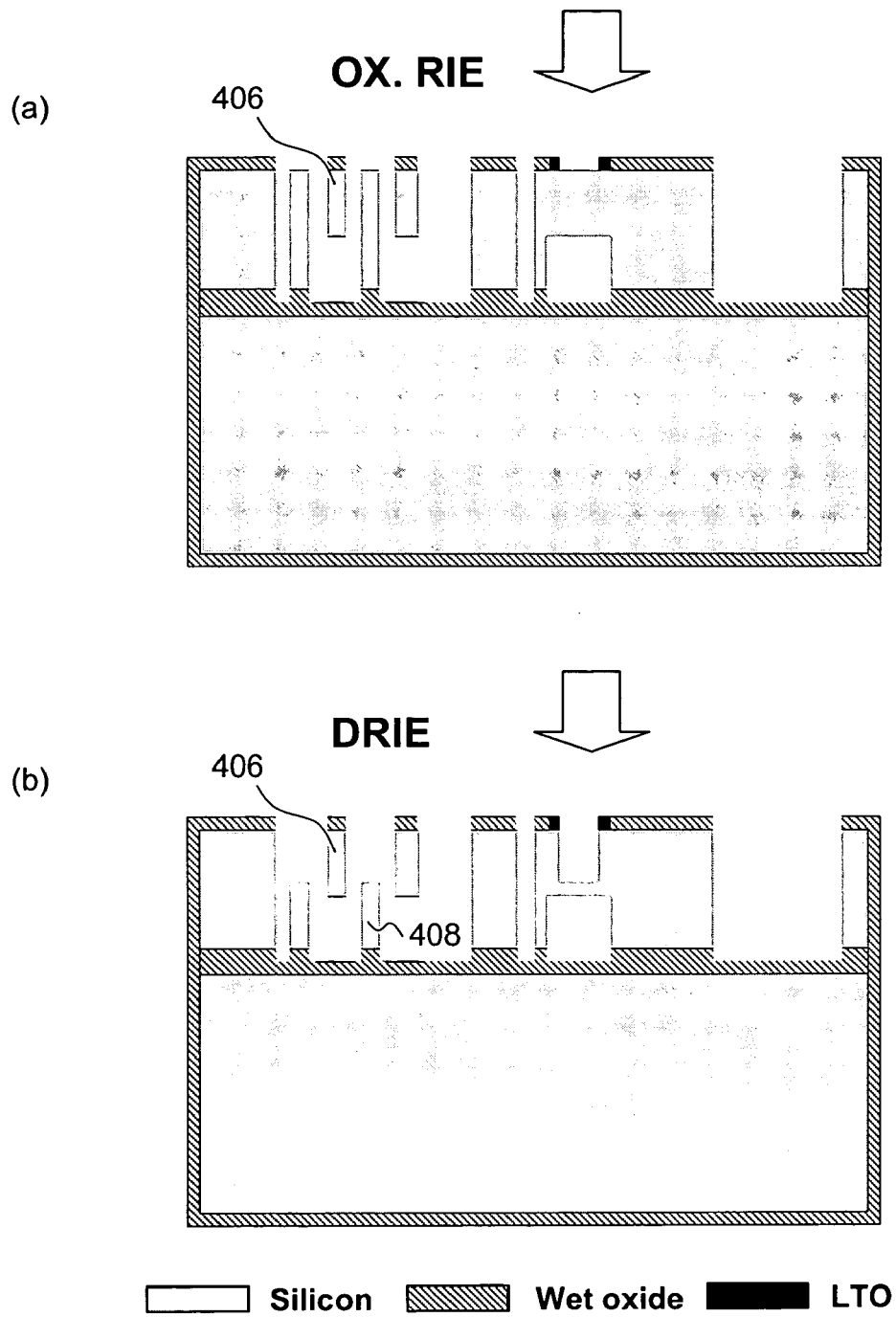
Figure 6:
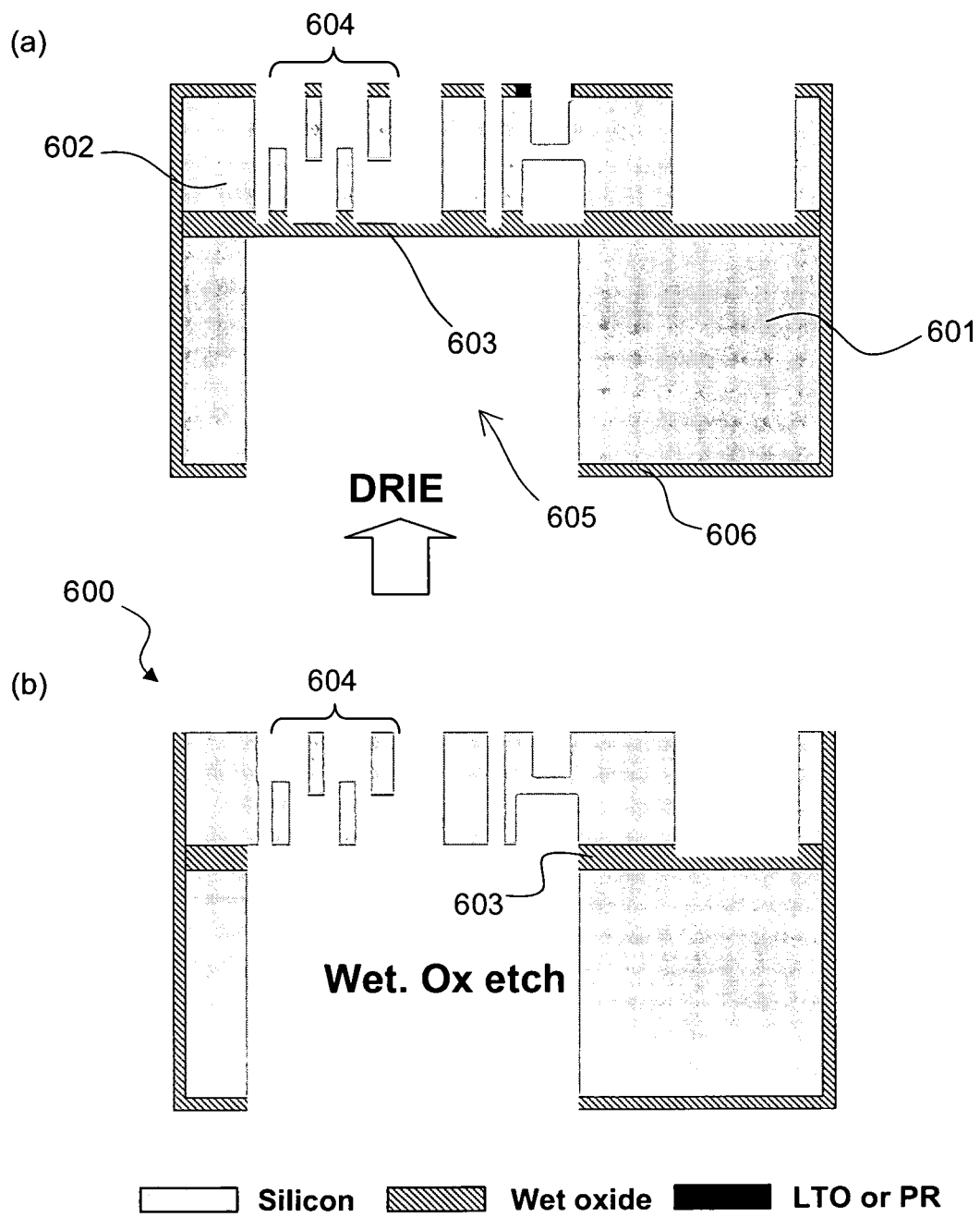
FIG. 6 is a sequence of cross-sectional diagrams continuing from FIG. 5 depicting an optional etching from the backside and removal of buried oxide layer after completion of upper silicon layer micromachining according to an embodiment of the invention.

FIG. 6 depicts a sequence of process steps subsequent to those depicted in FIG. 3-FIG. 5 in a version of the process where the backside etch is performed after the completion of front-side (upper layer) etches. A thick photoresist mask is formed on a wet thermal oxide 606 that covers the backside of the handle wafer 601 of an SOI wafer. Portions of the backside not covered by the mask are etched, e.g., by DRIE as indicated at (a) of FIG. 6 to form a cavity 605. In such a process, when the backside etch reaches a buried oxide 603 beneath desired structures 604 formed in a device layer 602, the device requires a quick wet oxide etch or plasma oxide etch to fully release the structures 604 from the buried oxide layer 603 to form a finished device 600 as indicated at (b) of FIG. 6. The finished device 600 may optionally be coated with metallization in such a way as not to short circuit the electrodes in the device layer 602 (e.g., using directional metal evaporation). This step provides significantly higher conductivity to the device structures and may also improve optical reflectivity of a mirror surface formed in the device layer.

Figure 7:
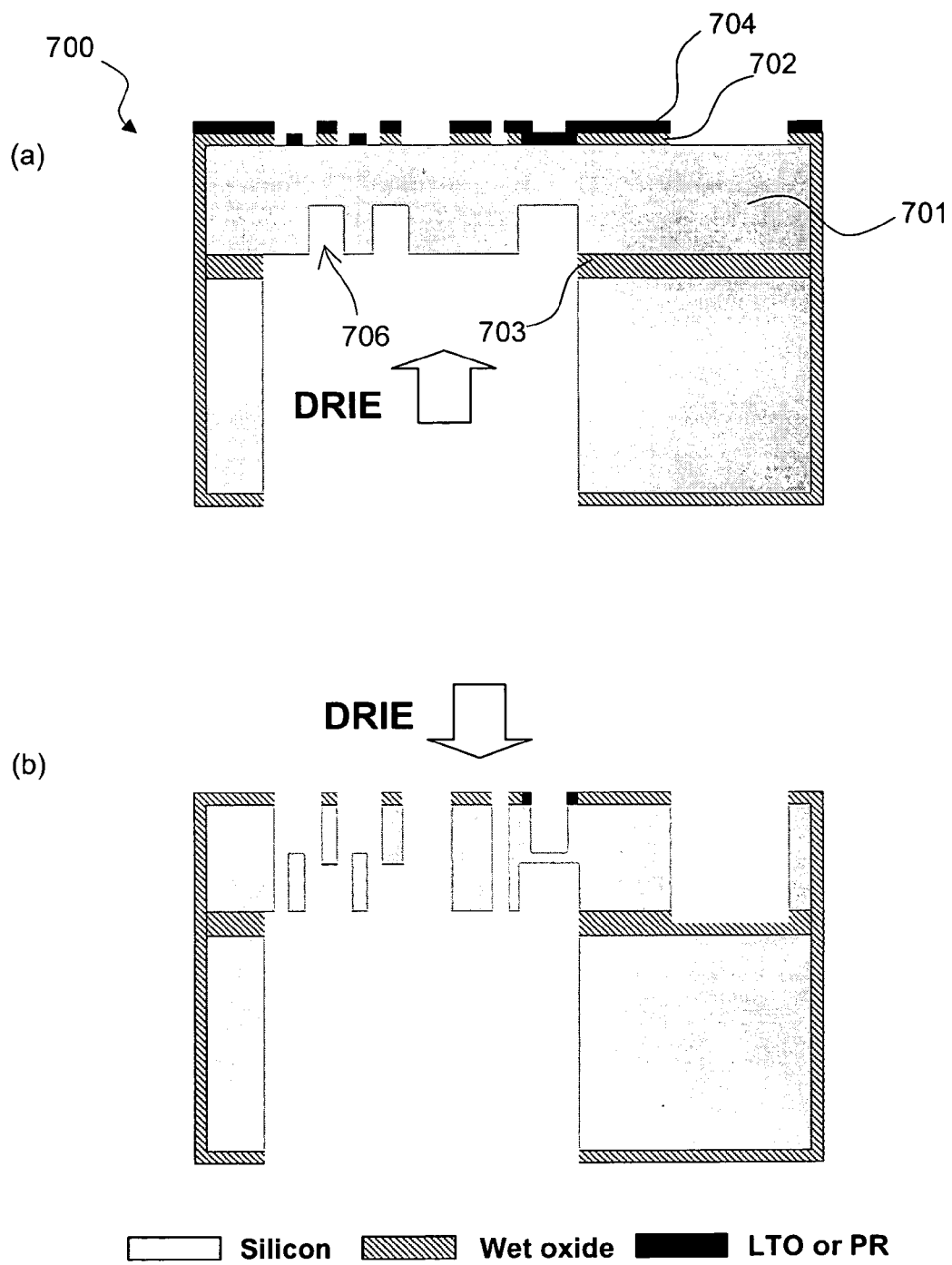
FIG. 7 is a sequence of cross-sectional diagrams depicting an optional etching from the backside and removal of buried oxide layer before the micromachining of the upper silicon layer according to an embodiment of the invention.

FIG. 7 depicts a sequence of process steps in a version of the process where the backside etch is performed before the front-side (upper layer) etch steps. As described above with respect to FIG. 4, first and second frontside masks 702, 704 may be formed on a device layer 701 of an SOI wafer 700 to facilitate front-side etch steps. In such a process, as shown at (a), when the backside etch reaches a buried oxide layer 703 beneath desired structures 706, the device requires a quick wet oxide etch or plasma oxide etch to remove the oxide layer 703 to expose selected portions of the backside of the device layer 701. If backup etches have not yet been performed on the backside of the device layer 701, as in the SOI wafer forming of FIG. 3, that etch can be performed at this point to form (or partly form) the structures 706, e.g., by a timed etch part of the depth into the device layer 701. After these steps, as shown at (b) the wafer processing may continue from the front-side, e.g., as described above.

Figure 8A:
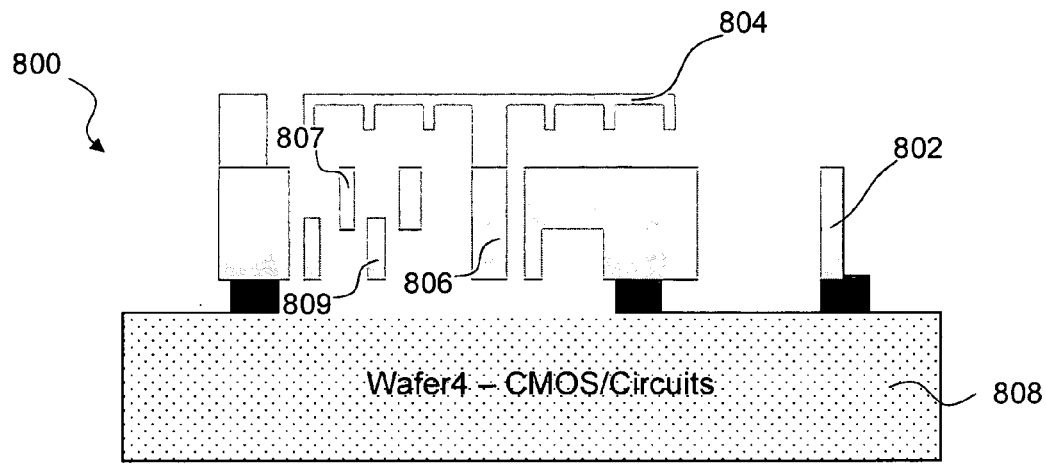
FIG. 8A is cross-sectional diagram of the completion of fabrication steps in which the upper silicon layer has a low-inertia mirror attached on the top and the upper silicon layer is attached directly onto control circuitry, according to an embodiment of the invention.

Although in some embodiments a mirror is formed directly from the device layer, mirrors, or other optical elements, may be formed separately and bonded to a device mount. Furthermore, although as described above and depicted e.g., in FIG. 1, a key feature of the invention is a single substrate which may be combined with a silicon handle wafer as an SOI wafer, but can also be bonded onto other types of substrates, including directly onto a circuits (e.g. CMOS) substrate with control and sense circuits directly below or adjacent to the MEMS. FIG. 8A is cross-sectional diagram of the completion of fabrication steps of a device 800 in which an upper silicon layer 802 has a low-inertia mirror 804 attached to a device mount 806 formed in the upper silicon layer 802, which is, in turn, attached directly onto control circuitry 808. The upper layer 802 also includes upper and lower combdrive structures 807, 809, which may be formed as described above.

Figure 8B:
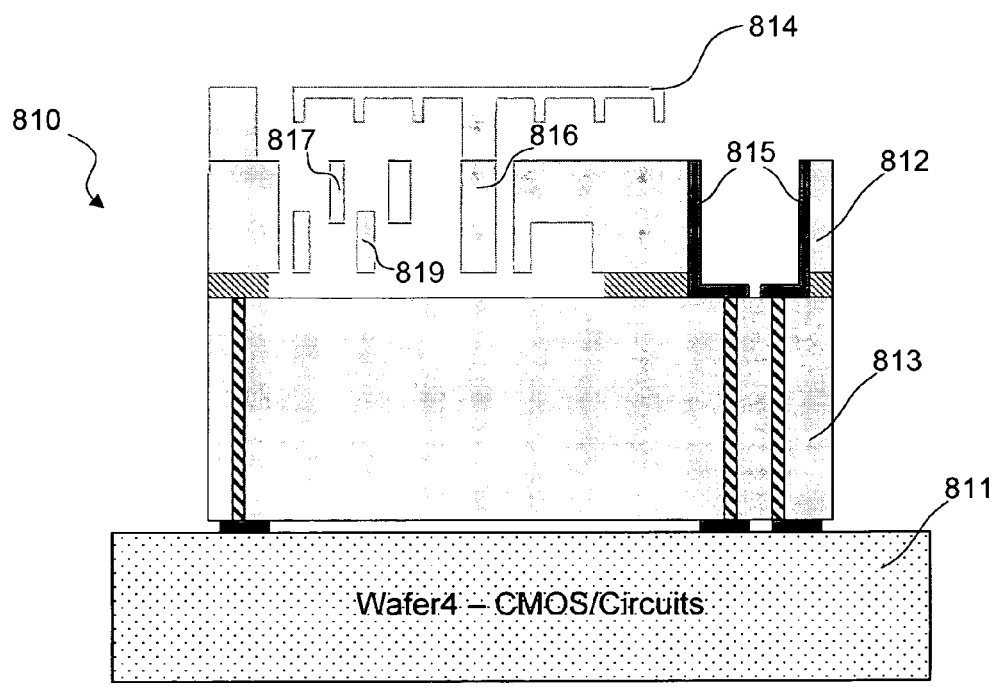
FIG. 8B depicts a cross-sectional diagram of the completion of fabrication steps in which the lower silicon layer contains vias for electrical interconnects between the actuators and the control circuitry attached beneath the lower silicon layer, according to an embodiment of the invention.

FIG. 8B depicts a cross-sectional diagram of a device 810, which is a variation on that shown in FIG. 8A. The device 810 includes an upper layer 812 bonded to a lower silicon layer 813 (e.g., as in the case where both layers are formed from an SOI wafer). The upper silicon 812 has a low inertia mirror 814 attached to a device mount 816 formed and upper and lower combdrive structures 817, 819, which may be formed as described above. The lower silicon layer 813 contains vias 815 for electrical interconnects between the comb drives 817, 819 and control circuitry 811 attached beneath the lower silicon layer 813. It is therefore possible to utilize such a special substrate in the SOI forming steps of FIG. 1, such that it is later possible to access the upper layer electrodes from the backside of the SOI wafer.

FIGS. 9A-9G are a set of cross-sectional diagrams of many possible combinations of Upper and Lower combfingers which provide specific types of actuation. A voltage difference between fixed (stator) comb fingers and rotor (movable) comb fingers produces a torque that causes rotation (as indicated by curved arrows or linear movement (as indicated by vertical arrows. In the examples depicted in FIGS. 9A-9G a voltage $V_1$ is applied to stator comb fingers while the rotor comb fingers are kept at ground potential.

A basic building block for a two-axis scanner is a one-axis rotator with the comb-finger cross-section as depicted in FIG. 9A or FIG. 9B, depending on the desired direction of rotation. As seen in FIG. 9A and FIG. 9B, each actuator 900, 920 is composed of opposing comb-fingers such that up actuation on one side and down actuation on the other side results in pure torque and no net vertical or lateral force. Such balanced rotators 1700, 1710 are also shown in 3D schematics in FIG. 17A and FIG. 17B respectively.

The overlap area of comb-fingers on either side of the actuator 900 depicted in cross-section in FIG. 9A has opposing rates of area change in case of lateral or vertical translation. However, during rotation (i.e. in the desired mode,) overlap area increases on both sides and creates a nonzero overall area change. Because the comb-fingers are rectangular in their cross-sections, and start with an initial overlap, as seen in FIG. 9A, calculations of exact overlap areas during rotation are more difficult than in the case of traditional lateral comb-drives or vertical comb-drives in pistoning mode. However approximations can be made to describe the geometry. The differential area increase dA can be approximated as a wedge (triangle) from the rotation axis to the rotor (movable comb finger) tip, less the wedge from the rotation axis to the stator (fixed comb finger) tip. The desired quantity dA/dθ is calculated from those two triangle areas as follows:

$$dA \approx \frac{1}{2} r_1 \cdot r_1 d\theta - \frac{1}{2} r_2 \cdot r_2 d\theta \qquad \text{eq. (1)}$$

$$\frac{dA}{d\theta} \approx \frac{1}{2}(r_1^2 - r_2^2), \qquad \text{eq. (2)}$$

where $r_1$ is the distance of the rotor finger tip from the rotation axis, and $r_2$ is the distance of the stator finger tip from the rotation axis of the actuator 960 depicted in FIG. 9F. This approximation is good to within ~5%. Because the fingers are initially pre-engaged such that linear operation from onset can be assumed, we can make a further approximation, neglecting fringing field effects:

$$\frac{dC}{d\theta} \approx 2\frac{\varepsilon_0}{g} \cdot \frac{dA}{d\theta} \approx \frac{\varepsilon_0}{g}(r_1^2 - r_2^2), \qquad \text{eq. (3)}$$

where $\varepsilon_0$ is air permittivity and g is the gap distance between opposing comb-fingers. The factor 2 in eq. (3) comes from the fact that a comb-finger has two sides that contribute to the capacitance. By plugging eq. (3) into the well-known torque equation one obtains, $$\tau = N\frac{1}{2} \cdot \frac{dC}{d\theta} \cdot V^2 \approx \frac{N \cdot \varepsilon_0 \cdot V^2}{2g} \cdot (r_1^2 - r_2^2), \qquad \text{eq. (4)}$$

accounting for N comb-fingers in an actuator. Due to the complex actuator geometry, a more precise numerical solution to dA/dθ should be used that accounts for the shape of the comb-finger and offsets in rotation axes beyond this range. Fringing fields at the outer extents of the finger travel result in capacitance greater than expected by simple overlap area, making (2) less accurate.

This approximation is only valid in the range $0° < \theta < \theta_{max\_lin}$, where $\theta_{max\_lin}$ is a disengagement angle. Rotation is an out-of-plane motion and eventually causes the finger-tips to disengage. As the comb-finger tips pass through, the rate $dA/d\theta$ is no longer constant and the drive force no longer follows the voltage-squared law of eq. (4). Comb-finger thickness and comb-finger length are the two main parameters that determine this disengagement angle $\theta_{max\_lin}$. The simplest approximation for the maximum angle is thus simply $\theta_{max\_lin} \approx \tan^{-1}(S/r_1) \approx S/r_1$ (FIG. 9). The drive will still continue to rotate past $\theta_{max\_lin}$, however the rate $dA/d\theta$ decreases and eventually changes sign, i.e. the area begins to decrease and the vertical comb drive loses further drive ability. This determines the maximum amount of rotation $\theta_{max}$. The increasing effect of fringing fields makes $dA/d\theta$, $\tau$ and even $\theta_{max}$ difficult to calculate.

A trade-off in designing these types of actuators is that available torque increases with length squared (eq. (2)), but at the same time limits the maximum available angle linearly and increases the likelihood of pull-in instability. For negative angles, clockwise in FIG. 9A, eq. (3) continues to apply, but only for a very short range before the upper comb-fingers rotate out of plane and disengage from the lower fingers. Beyond this point, $\tau$ is very small and is difficult to calculate due to the effect of fringe fields. Generally speaking, these actuators are not effective for angles less than 0°.

It should be noted that above discussion pertains only to static actuation of the rotator vertical combdrives, while their operation at the natural resonant frequency of the mechanical structure can be quite different, depending on the forcing waveform in the actuators. By choosing a proper pulsed-forcing waveform that allows the high-Q resonance to build up amplitude passed the limitations given above as $S/r_1$, very large peak-to-peak amplitudes can be achieved. In one device, over 55° peak-to-peak optical deflection was measured. This was done by applying a pulsed waveform with 54% duty cycle at 4447 Hz, which was previously determined to be the main resonant frequency of the device.

Figure 18A:
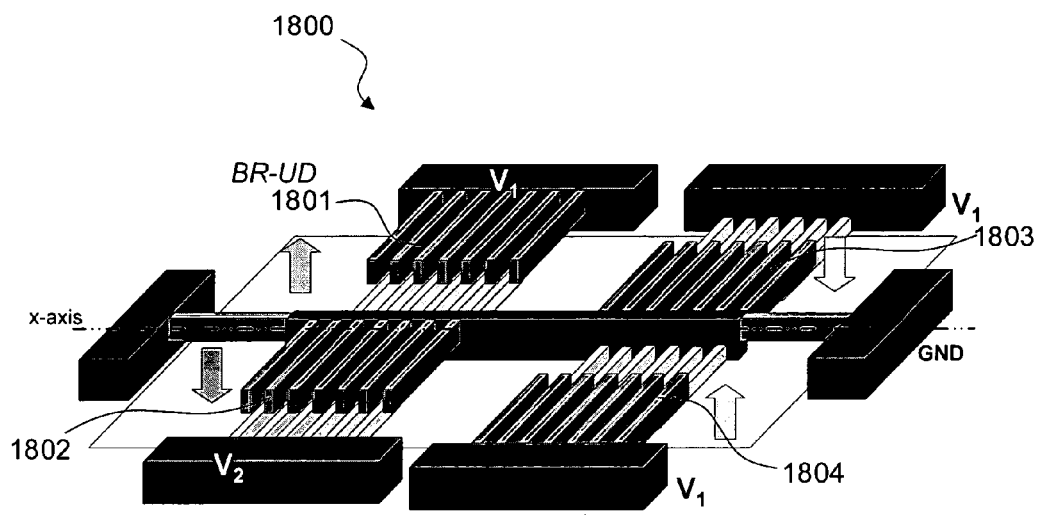
FIG. 18A is a 3D schematic of a vertical combdrive balanced bi-directional rotator which rotates to angles above and below the zero angle, according to an embodiment of the invention.
Figure 18B:
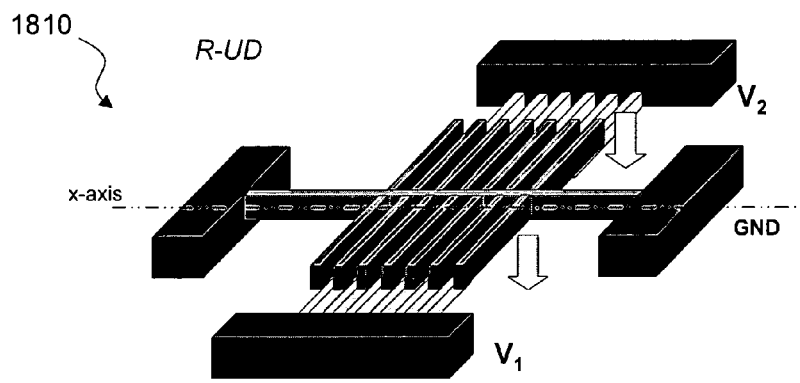
FIG. 18B is a 3D schematic of a vertical combdrive bi-directional rotator which rotates to angles above and below the zero angle, according to an embodiment of the invention.

The type of actuators 940, 960 depicted in cross-section in FIG. 9C and FIG. 9E respectively, with a 3D schematic depicted as 1818 in FIG. 18B utilizes Down combdrives on both sides, resulting in bi-directional rotation (as indicated by the double curved arrows in FIG. 9E) when one side is activated at a time, though with some unwanted lateral and vertical motion. With both sides activated, it gives a pistoning downward motion (as indicated by the downward vertical arrow in FIG. 9C). The same approximations from eq. (1)-eq. (4) above apply, except that only one half of the total number of combfingers actuate in either direction.

The type of actuator 930 depicted in cross-section in FIG. 9D utilizes Up combdrives on both sides, resulting in bi-directional rotation when one side is activated at a time, though with some unwanted lateral and vertical motion. With both sides activated, it gives pistoning Up motion (indicated by the upward pointing vertical arrow).

Figure 16A:
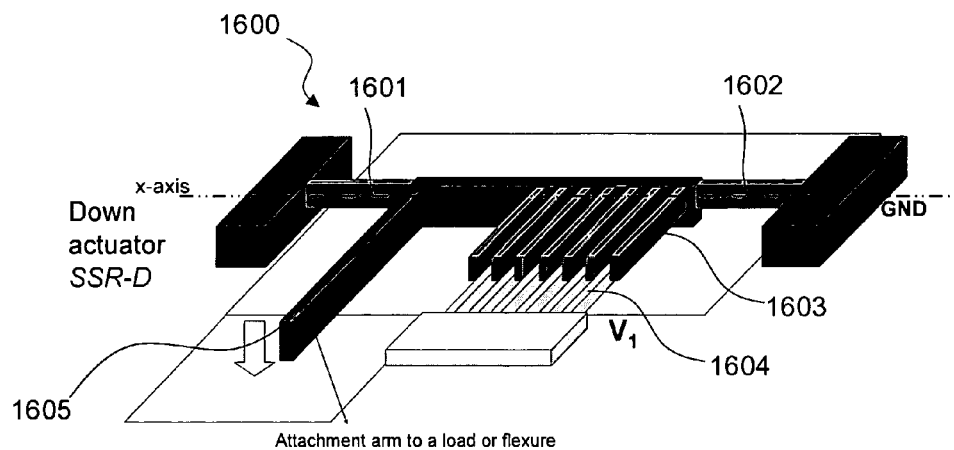
FIG. 16A is a 3D schematic of a vertical combdrive single side rotator which moves the load-attachment arm in a downward direction, according to an embodiment of the invention.
Figure 16B:
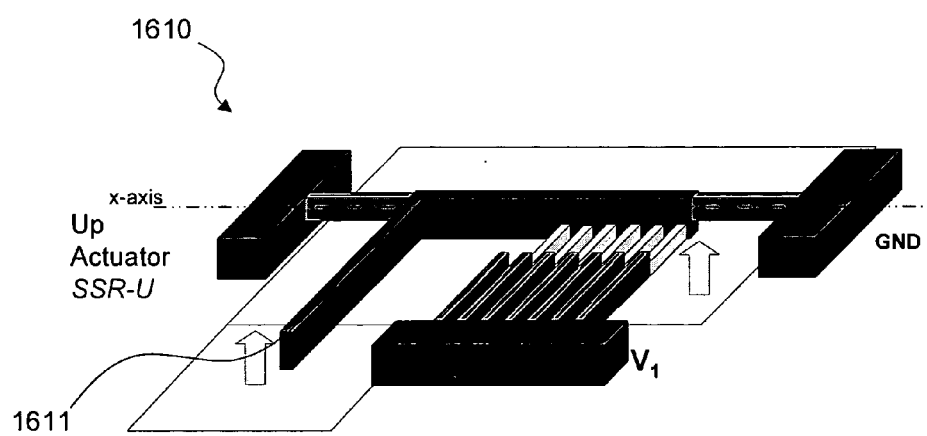
FIG. 16B is a 3D schematic of a vertical combdrive single side rotator, which moves the load-attachment arm in an upward direction, according to an embodiment of the invention.

Another type of actuator 950 indicated in cross-section in FIG. 9F, utilizes only Down combs to provide uni-directional rotation. The trade off is that, given the same space considerations as in the previous cases, the torque arm can be twice as long giving four times the torque. This type of most basic single-sided rotator (SSR) is also shown in 3D schematics of FIGS. 16A-16B. Specifically, FIG. 16A depicts a downward rotating SSR 1600 and FIG. 16B depicts an upward rotating SSR 1610. A working device 1420 based on such single sided rotators has been demonstrated and is depicted in the electron micrograph of FIG. 14C.

Yet another type of actuator 960, depicted in cross-section in FIG. 9G, utilizes full thickness, Full beams for combfingers which are perfectly overlapping at rotation angle $\theta$ equal to zero. However, as angle $\theta$ increases beyond zero to either direction, applying voltage to this actuator gives reverse-force, i.e. force to return the actuator to angle $\theta$ equal to zero. Such reverse force can be utilized in a closed-loop control system to provide artificial damping and artificial stiffening of the actuator and overall significant response time improvement. An additional purpose for such combdrives is to utilize them as isolated sets of capacitance sense fingers. In that case, during the device operation, monitoring the capacitance on those combdrives provides position feedback for closed-loop feedback control. Equations governing these types of combfingers follow from above, approximating the area change and therefore torque as:

$$\tau \approx -\frac{N \cdot \varepsilon_0}{2g} \cdot (r_1^2 - r_2^2) \cdot V^2, \theta \neq 0 \qquad (5)$$

When used in capacitive sensing circuits, reference capacitors are fabricated on chip utilizing the same layout in order to insure matched capacitances.

Figure 19A:
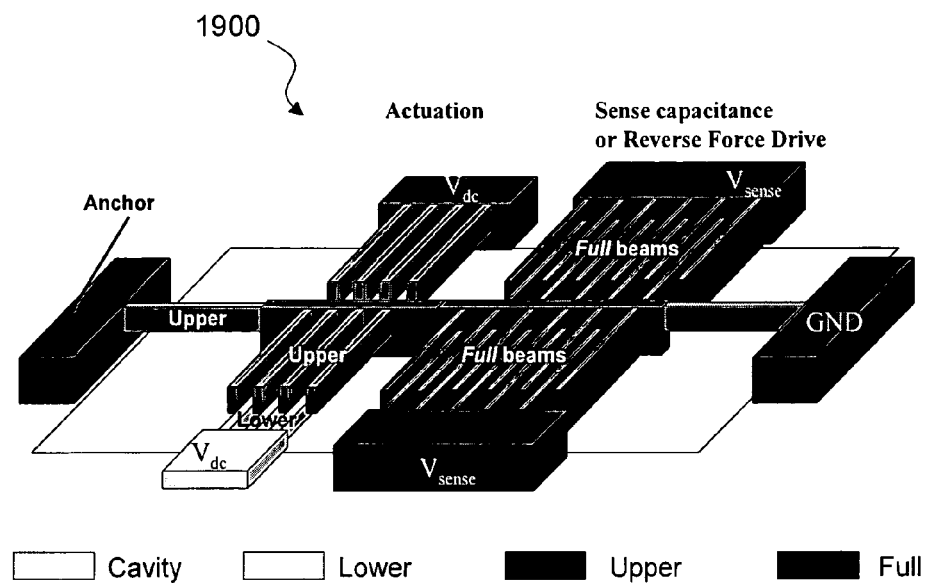
FIG. 19A is a 3D schematic of an embodiment of the invention in which vertical combdrive with Upper and Lower fingers is combined with a vertical combdrive with Full thickness fingers for capacitive position sense or reverse force application.
Figure 19B:
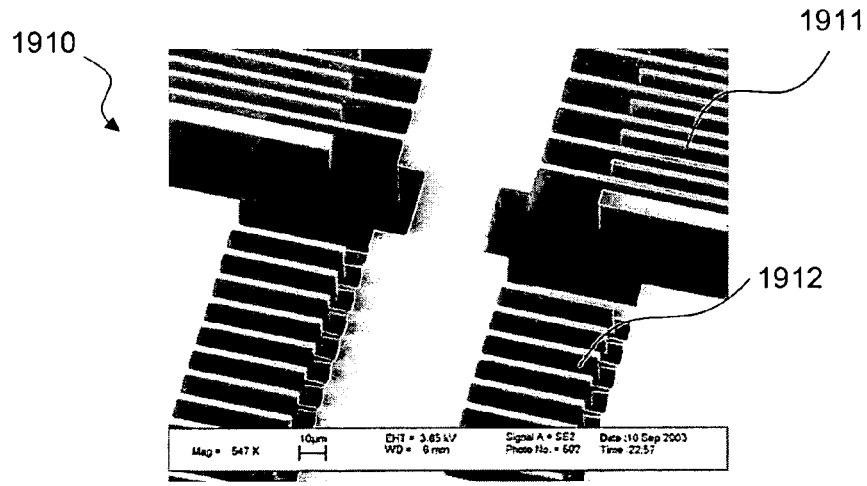
FIG. 19B is an SEM micrograph of an embodiment of the invention corresponding to the schematic of FIG. 19A.

Examples of application of such actuators are given in the 3D schematic of device 1900 in FIG. 19A and the corresponding SEM micrograph in FIG. 19B. Device 1910 in FIG. 19B utilizes a vertical combdrives 1912 with cross-section of FIG. 9A for balanced rotation. On the same rotating shuttle are full thickness combdrives 1911 corresponding to cross-section FIG. 9G, which, as explained above, can have different purposes.

Figure 10:
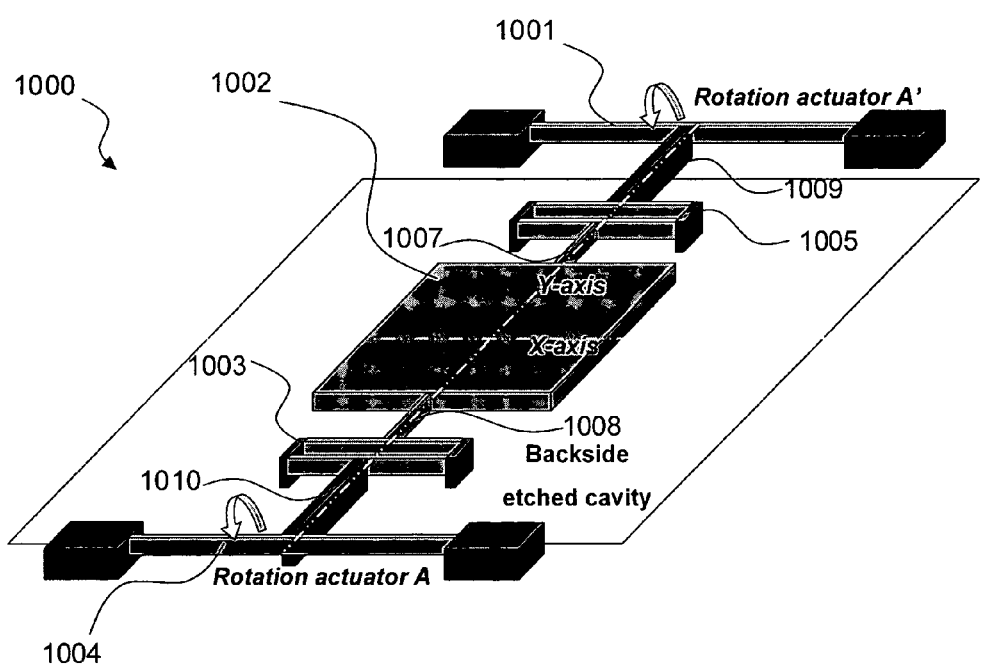
FIG. 10 is a 3D schematic of a one axis micromirror device with two rotators, two 1 DoF linkages and a mirror plate according to an embodiment of the invention.

As a step toward implementing gimbal-less two-axis devices, one-axis devices such as the device 1000 depicted in the 3D schematic of FIG. 10, have been developed. The device 1000 generally includes a micromirror plate 1002 connected to rotation actuators 1001, 1004 via inside linkages 1007, 1008, rotation transformers 1003, 1005 and outside linkages 1009, 1010. All of these components may be fabricated from the same device layer, e.g., as described above. In particular, the rotations may be combdrive actuators of any of the types described above. One or both of the rotation transformers 1003, 1005 includes a flexure beam that allows rotation of the mirror plate 1002 with respect to an X-axis. One or more of the linkages 1007, 1008, 1009, 1010 may include a beam that allows rotation of the micromirror plate 1002 with respect to a Y-axis that is non-parallel (e.g., perpendicular) to the X-axis. To illustrate the principle of operation only a single pair of actuators 1001, 1004 that impart rotation about the X-axis are shown.

Figure 11A:
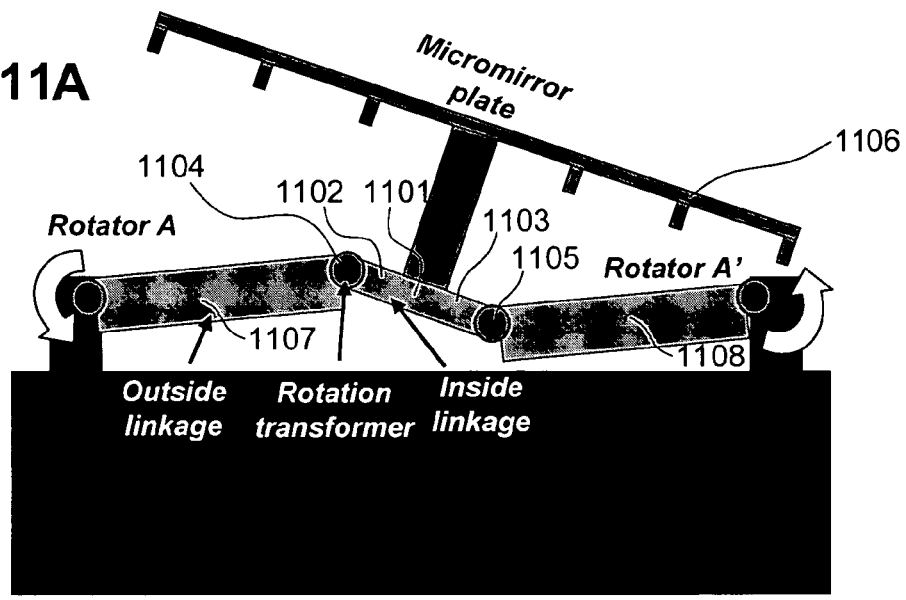
FIG. 11A is a cross-sectional diagram of a micromirror device in which opposing rotation of each rotator results in rotation of the micromirror plate which is bonded onto the optical stage and is at a level above the actuators and linkages, according to an embodiment of the invention.
Figure 11B:
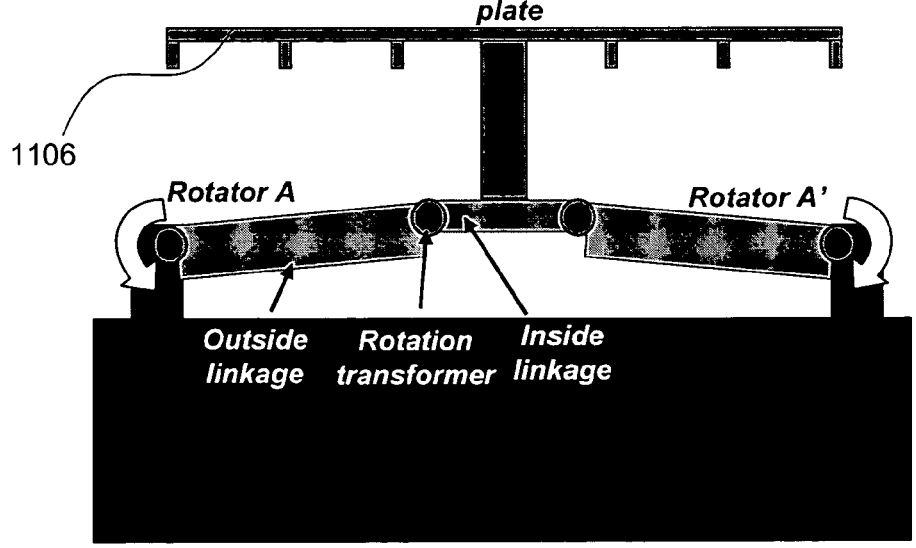
FIG. 11B is a cross-sectional diagram of a micromirror device in which common-mode rotation of each rotator results in vertical pistoning of the micromirror plate, according to an embodiment of the invention.
Figure 17A:
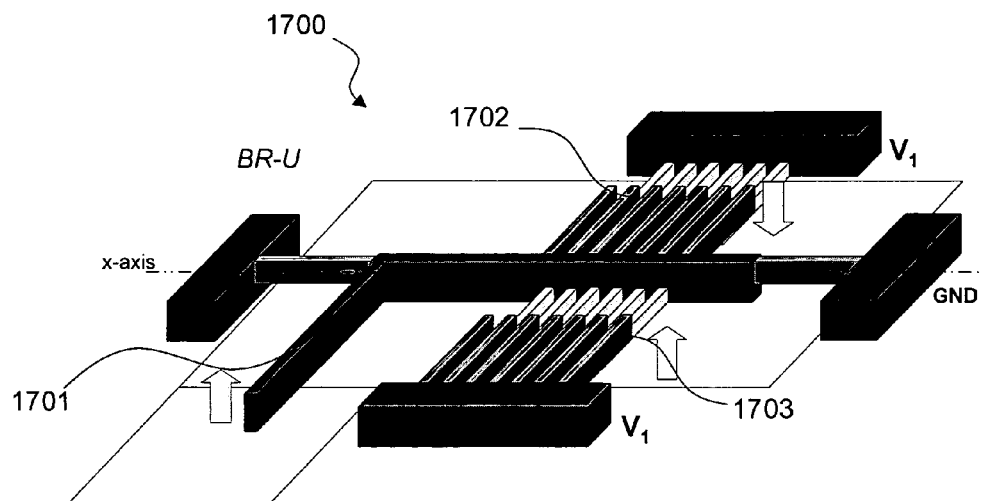
FIG. 17A is a 3D schematic of a vertical combdrive balanced rotator, which moves the load-attachment arm in an upward direction, according to an embodiment of the invention.

The device 1000 operates based on the methodology shown in the cross-sectional schematics of FIG. 11A and FIG. 11B. Two rotating actuators A, A' are placed in parallel and arranged to rotate in the same direction (e.g., counter clock-wise, as shown in FIG. 11A). A device mount 1101 is connected to the actuators A, A' by inside linkages 1102, 1103 rotation transformers 1104, 1105 and outside linkages 1107, 1108. All of these components may be formed from the same device layer. Note that in FIGS. 11A-11B, a micromirror plate 1106 is attached to the device mount 1101. As the rotators A, A' rotate counterclockwise the outside linkages 1104, 1105 and inside linkages 1107, 1108 impart an opposing action. Namely, although both rotators can be of balanced rotator type for "pure" rotation, the attachment of the linkage determines whether the linkage is therefore rotated up or down, as depicted in FIG. 17A with device 1700 arranged to actuate the linkage up or device 1710 of FIG. 17B to actuate the linkage down. The rotator A on the left in FIGS. 11A-11B actuates its outside linkage 1107 up, while the rotator A' on the right actuates its linkage 1108 down. As a result, the inside linkages 1102, 1103 effectively achieve rotation in the opposite (clock-wise) direction from the actuators A, A'. By the help of the linkages which act as transformers of rotation and are 1 degree of freedom (DoF) flexures, actuator rotation displaces the inside linkages 1102, 1103 in opposite directions and rotates the mirror 1106 clockwise. Since the outside linkages 1107, 1108 and inside linkages 1102, 1103 experience the same vertical motion at the end of the transformer, the linkage rotation is inversely proportional to its length. Therefore, the ratio of actuator and mirror rotations can be scaled by changing the ratio of lengths of the inside linkages 1102, 1103 and corresponding outside linkages 1107, 1108. As explained above, for vertical combdrive actuators, vertical comb drive stroke is limited by the device layer thickness and is given as $S/r_1$. By scaling the linkage lengths however, it is possible to drive mirrors to rotation angles well beyond the rotational range of the actuators. This mechanical gain feature is explained in more detail below.

Figure 12A:
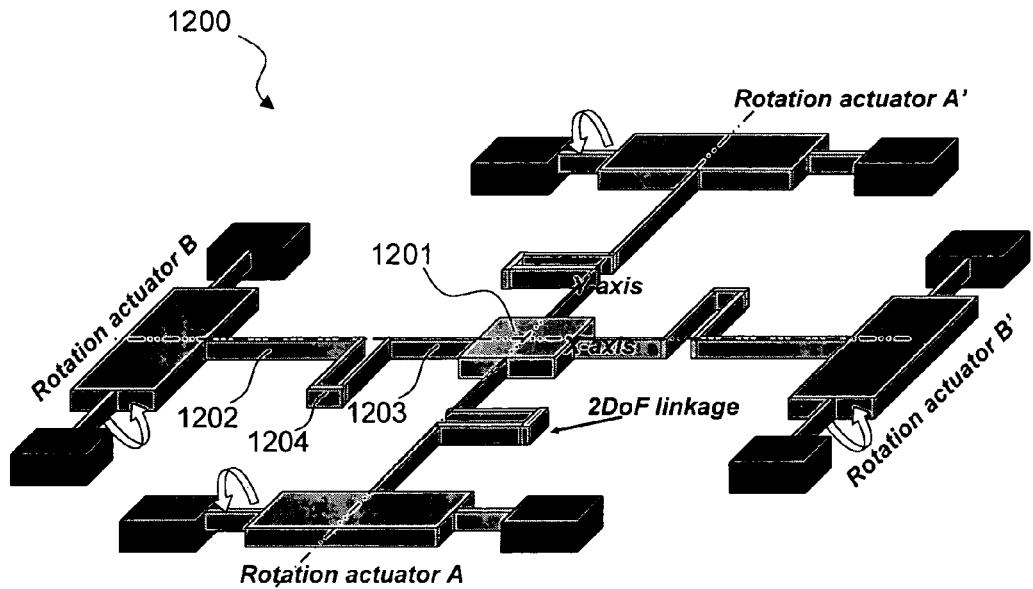
FIG. 12A is a 3D schematic of a two-axis non-gimbaled actuator with four rotators, four linkages, and an optical stage or mirror plate at the same level as the actuator and linkage according to an embodiment of the invention.
Figure 12B:
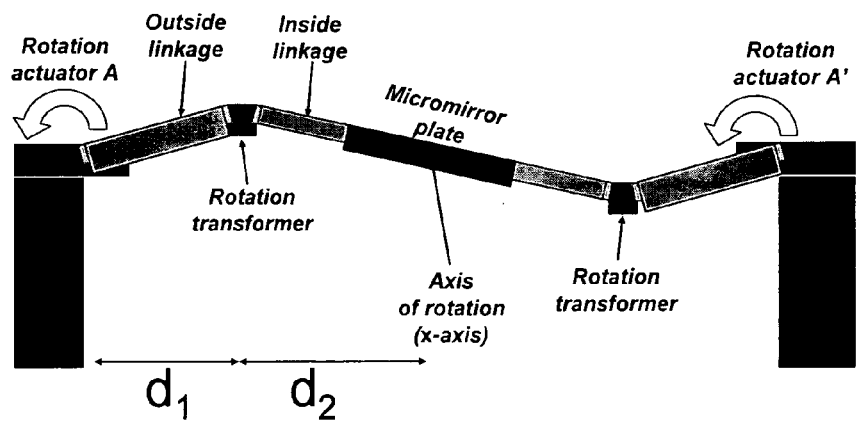
FIG. 12B is a cross-sectional diagram of the embodiment of the invention in FIG. 12A in which opposing rotation of each rotator results in rotation of the micromirror plate.

To achieve the goal of fast two-axis scanning, one can combine multiple one-axis rotators positioned orthogonally, as depicted in FIGS. 12A-12B, and utilize 2 DoF mechanical linkages to allow two-axes of rotation for a central device mount or micromirror. The problem is how to combine one-axis scanners of the types discussed above, and allow the operation of one scanner about one axis to be nearly independent of the operation of another scanner about another (non-parallel) axis. The proposed solution is schematically shown in FIG. 12A, and fabricated as devices 1300, 1310 depicted respectively in FIG. 13A and FIG. 13B. Specifically, two one-axis rotators are utilized for each axis of the overall 2D scanner. For the x-axis, actuators A and A' are utilized, and for the y-axis, actuators B and B'. The actuators may be combdrive actuators of any of the types described above. Each actuator is attached to a device mount 1201 (e.g., a mirror or stage) through a set of linkages 1202, 1203 and a mechanical rotation transformer 1204. As depicted in FIG. 12B, the operation of the device 1200 about a single axis may be implemented discussed above with respect to FIGS. 11A-11B. It should be added that the inside linkages 1203 are designed such that they allow torsion on axis, specifically during the operation of the device to rotate the device mount 1201 about an axis orthogonal to the torsion axis of the linkage. Each rotation transformer 1204 includes a flexure beam that allows torsion on an axis that is non-parallel (e.g., perpendicular) to the corresponding linkage 1203. In other words, the combination of the linkages 1202, 1203 and rotation transformer 1204 act as a bi-axial linkage mechanically coupled between the device mount 1201 and the rotators and acts as a two degree of freedom (2 DoF) mechanical component which allows rotation about one axis via the rotation transformers, and allows de-coupling from the orthogonal axis via torsional compliance, usually in the inside linkage.

An important design feature is that the position of the mechanical rotation transformer in FIG. 11 and FIG. 12B governs the mechanical rotation gain G between the rotation of the actuators and the rotation of the device mount 1201. Specifically, since the actuator rotates about its axis, and the device mount 1201 rotates about a virtual stationary axis (due to opposing actuations on either side in FIG. 11A,) the angles relate as $\theta_{mirror}/\theta_{act}=G=d_2/d_1$. In that, $d_2$ is the length of the inside linkage from the transformer to the mirrors center, and $d_1$ is the length of the outside linkage from the actuator's axis to the transformer. This feature is very beneficial due to the following: the maximum angle of each rotator is given by combdrive dimensions and limited as discussed above, while the angle of the device mount 1201 can be arbitrarily increased by using G>1. Moreover, proper design use of mechanical gain can significantly increase overall device speed as $G^{-1/2}$, because it allows increased finger length and torque while achieving the same desired large angles of micromirror rotation.

A variety of designs have been designed and fabricated, utilizing 3 or more one-directional actuators arranged around the central mirror. Two examples of four-actuator devices 1300, 1310 are given in the SEM micrographs of FIG. 13A and FIG. 13B respectively. Several devices of each kind were tested. By electrically activating the proper pair of electrodes, different actuation modes have been independently demonstrated. Firstly, to characterize static deflection for each axis, the corresponding actuator pairs (A and A' for x-axis, and B and B' for the y-axis) were used in common mode (same voltage applied.) By observing the deflection of a laser beam against a metric wall, it was possible to measure the rotations of both the micromirror as well as the actuators which reflect a small portion of the beam (the laser beam covers the entire device.)

Figure 13C:
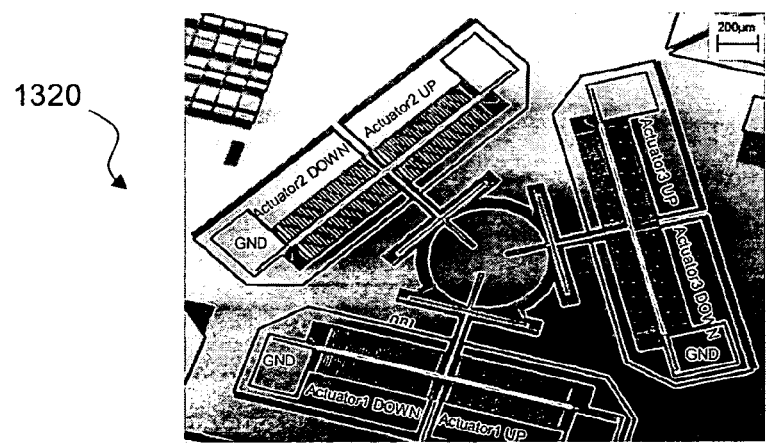
FIG. 13C is an SEM micrograph of an embodiment of the invention with three bi-directional balanced rotators to scan an integrated micromirror in 3 DoF, tip tilt and piston.

Instead of 4 actuators placed at right angles, a device 1320 having 3 actuators are sufficient to achieve efficient actuation, when arranged at 120° to each other as shown in FIG. 13C. This has a benefit of reduced area, but also a direct mechanical advantage. In such a 'triangle' arrangement, any inside linkage only rotates ½ of the angle of mirror rotation to allow de-coupling. We have fabricated and tested devices with triangle arrangement although they require more involved control due to the required mapping between the three axes and the more commonly used Cartesian x, y co-ordinate system. The device shown in FIG. 13C has 3 bi-directional balanced-rotators (of the type depicted schematically in FIG. 18A), such that any of the actuators can either actuate the linkages up or down, depending on which electrode is activated. For testing of the "actuator 1" axis in +angle direction e.g., "actuator 1" was actuated downwards while actuating actuators 2 and 3 were actuated upwards. The actual axis of that rotation is parallel to the shuttle of "actuator 1". An opposite arrangement gives a negative angle direction. Analogous measurements were performed for the other two other arrangements of actuators, again in both directions. All arrangements gave almost exactly the same optical deflections as the device is symmetric. In common-mode arrangements, pistoning actuation of this device from −30 μm to 30 μm has been observed. Specifically, by activating all three actuators the up direction, their rotations combine as a pure pistoning vertical motion of the micromirror. It should be noted that the different modes can be independently actuated and combined by activating proper electrodes with proper bias.

Figure 14A:
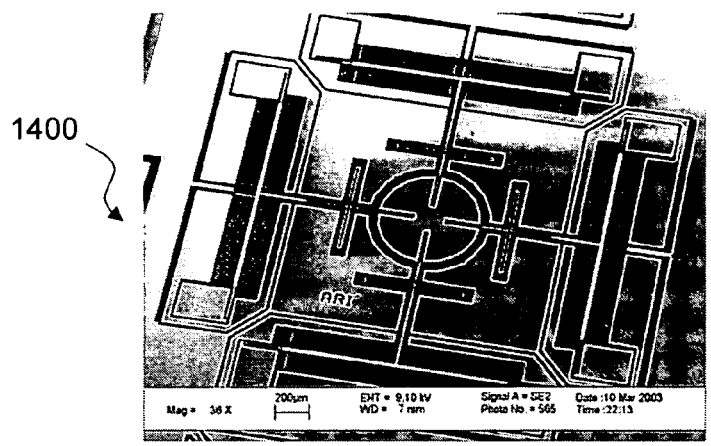
FIG. 14A is an SEM micrograph of an embodiment of the invention using four bi-directional rotators which surround the micromirror on four sides, to scan in two axes in positive and negative angles as well as to piston up or down.

FIG. 14A is an SEM micrograph of device 1400 with an arrangement of four bi-directional balanced-rotators (e.g., of a type depicted in FIG. 18A) which surround the circular micromirror and connected to it by four bi-axial linkages. The rotators are arranged at 90-degree offsets from each other to provide simplest and most direct transformations between their rotation and the desired two-axis rotation of the micromirror. Due to the fact that the rotators are bi-directional the overall capability of device 1400 is tip-tilt-piston actuation. Namely, in common mode actuation where, e.g., all rotators raise their linkages up, the central micromirror will raise up out of wafer plane as well. A combination of differential mode actuation (a rotator on one side pushing up while a rotator on the opposite side pushes down,) and common mode actuation (rotators pushing in same direction,) gives substantially independent control of all three DoF of motion, namely tip, tilt and piston.

Figure 14B:
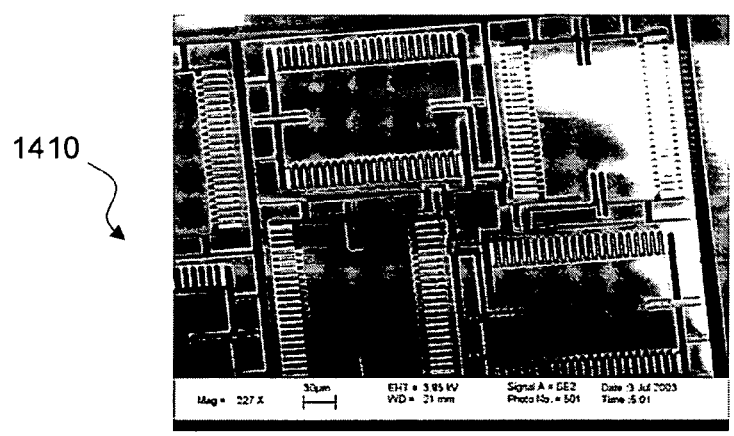
FIG. 14B is an SEM micrograph of an embodiment of the invention with an actuator as part of an N by M array of tip-tilt-piston actuators with 0.4 mm on a side with an arrangement of rotators in such a way that they nearly maximize usable area power density.

Device 1410 in FIG. 14B is another type of actuator arrangement for tip-tilt-piston actuation of a central mount intended for micromirror attachment, e.g., as shown schematically in FIG. 11. Four bi-directional rotators (e.g., of a type depicted in FIG. 18B) surround the circular micromirror and connect to it by four bi-axial linkages. The rotators are arranged at 90-degree offsets from each other to provide simplest and most direct transformations between their rotation and the desired two-axis rotation of the central mount. Due to the fact that the rotators are bi-directional the overall capability of device 1410 is tip-tilt-piston actuation. Unlike in device 1400, in device 1410 each bi-axial linkage is attached to each rotator in a non-central position, such that the rotators are positioned asymmetrically from the rotation axes. This allows substantially closer packing of the rotators into a box of 0.4 mm×0.4 mm on the side which is a critical design feature for small-element optical phased arrays with high fill-factor micromirrors.

Figure 14C:
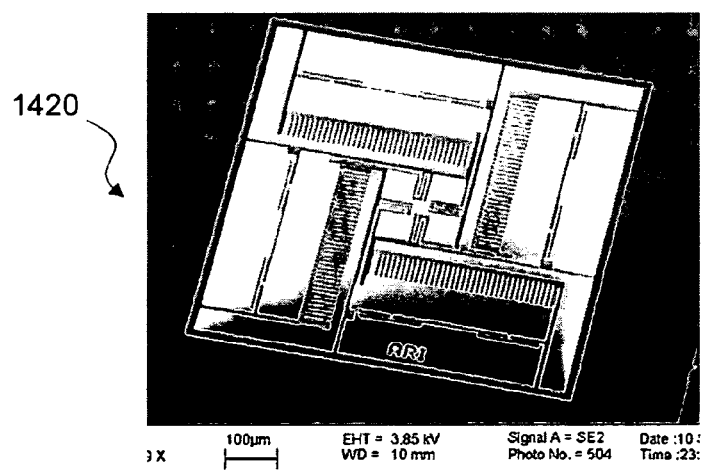
FIG. 14C is an SEM micrograph of an embodiment of the invention with an arrangement of rotators in such a way that they nearly maximize area usage for a very small tip-tip-piston actuator of 0.6 mm on a side.

Device 1420 in FIG. 14C is yet another type of actuator arrangement for tip-tilt-piston actuation of the central mount which is intended for micromirror attachment as shown schematically in FIG. 11. Four single-sided (uni-directional) rotators (FIG. 16A) surround the circular micromirror and connect to it by four bi-axial linkages. Although the rotators are uni-directional (in this case they can only can push the linkages down,) the overall capability of device 1420 is tip-tilt-piston actuation. As in device 1410, each bi-axial linkage is attached to each rotator in a non-central position, such that the rotators are positioned asymmetrically from the rotation axes. This allows substantially closer packing of the rotators into a box of 0.6 mm×0.6 mm on the side which is a critical design feature for small-element optical phased arrays with high fill-factor micromirrors.

In device 1420 of FIG. 14C, basic rotation of the mirror mount is achieved by providing more downward actuation to some rotators over others. In a preferred actuation scheme, all four down rotators may be actuated to half of their downward stroke. That point would be set as a reference zero rotation and piston point. Rotation would be achieved by reducing downward force at one side while increasing downward force on an opposite side. Pistoning down could be achieved by increasing the downward forces exerted by all the actuators while pistoning up could be achieved by subsequently decreasing the downward forces exerted by all the actuators.

All devices discussed until now utilize actuator arrangements in such a way that the rotation of the actuators provides either downward force or upward force to the outside linkages of given bi-axial linkages utilized. Instead of rotators, pure vertical actuators could be utilized to provide the upward or downward force. Furthermore, although much of the present description of actuators focuses on vertical combdrives, other types of actuators may be used, including those that operate via pneumatic, thermal, or magnetic principals, (e.g., coils that interact with external magnetic fields), electrostatic elements, such as gap closing electrodes, piezoelectric actuators and thermal bimorph actuators. Furthermore, the actuators, of whatever type, may include a mechanical biasing component, e.g., spring-loaded element, that tends to return the actuator to some neutral position when the actuating force is removed or reduced.

Figure 15:
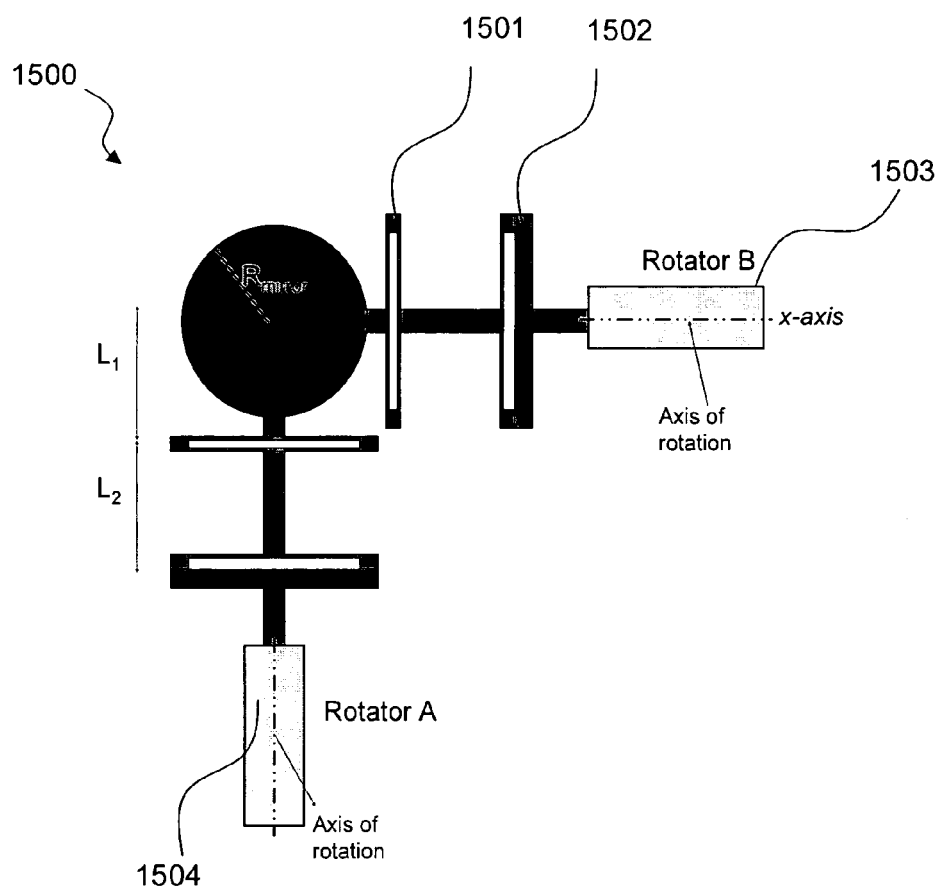
FIG. 15 is a plan view schematic of an embodiment of the invention for two-axis scanning with two rotators aligned on-axis with the axes of rotation and connected to the micromirror with 2 Degree of Freedom (2 DoF) linkages.

Another possible arrangement of actuators in schematically shown in FIG. 15. A linkage having two parallel flexures 1501, 1502 is coupled between a rotator 1503 and a micromirror or device mount. In this case the rotation of each rotator directly rotates each linkage because each rotator is parallel and connected substantially close to the actual axis of the linkage and a micromirror or device mount. The flexures 1501, 1502 are designed to allow the mirror or device mount to flex about a y-axis that is perpendicular to the x-axis. Two similar flexures may be coupled between a y-axis rotator 1504 and the micromirror or device mount. One of these flexures is located at a distance $L_1$ from the center of the mirror/device mount and a stiff beam of length $L_2$ separates the two flexures from each other. Therefore rotation of a rotator 1503 directly rotates the parallel flexures 1501, 1502 about an x-axis. In that mode of rotation, flexures 1501, 1502 are very stiff and allow almost all of the x-axis rotation from rotator 1503 to be transferred to the mirror/device mount. However, when rotator 1504 is rotated about the y-axis, and the mirror undergoes y-axis rotation, it is the two flexures 1501 and 1502 that allow that rotation to be decoupled from rotator 1503. This is therefore another case of a gimbal-less two-axis actuator.

FIGS. 16A-16B depicts some possible embodiments of single-sided rotators. In each case the devices include a movable shuttle supported by torsional flexures (1601 and 1602 in FIG. 16A,) and have a preferred freedom of motion the rotation about the x-axis. The rotation is achieved by the electrostatic attraction between the upper combfingers 1603 and lower combfingers 1604 in FIG. 16A in such a way that the upper combfingers 1603, which are free to move with the shuttle, are attracted downward toward the lower comb fingers 1604, which are fixed. An attachment arm 1605 is mechanically connected to the shuttle on the same side of the x-axis as the upper combfingers 1603. Because the attachment arm 1605 is connected on the same side of the shuttle as the combfingers 1603 it actuates in the downward direction and can be attached to some load such as a micromirror or bi-axial linkages connected to a micromirror or device mount. In another possible embodiment of device 1600 in FIG. 16A, the attachment arm 1605 could be attached on the opposite side of the axis such that during the combdrive rotation down, it raises up and therefore provides upward actuation to an attached load.

In the embodiment of a single-sided rotator 1610 in FIG. 16B, the combfingers are arranged in an opposite manner from the rotator 1600 of FIG. 16A. The lower combfingers are now attached to the movable shuttle suspended by torsional supports. Therefore by electrostatically actuating the structure by applying a static potential between electrodes V1 and GND, the lower combfingers will actuate upward. Because the attachment arm 1611 is on the same side of the shuttle as the lower combfingers, it provides upward force to an attached load. In another possible embodiment of device 1610 in FIG. 16B, the attachment arm 1611 could be attached on the opposite side of the axis such that during the combdrive rotation up, it lowers down and therefore provides downward actuation to an attached load.

Figure 17B:
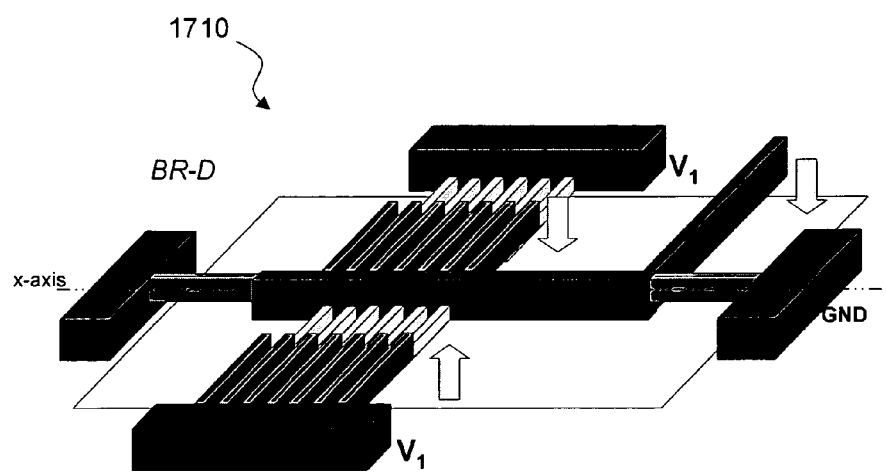
FIG. 17B is a 3D schematic of a vertical combdrive balanced rotator, which moves the load-attachment arm in a downward direction, according to an embodiment of the invention.

FIGS. 17A-17B show two possible embodiments of rotators in which combdrive actuators are arranged in such a way as to substantially cancel vertical and lateral translation while increasing rotational torque. These are therefore termed balanced rotators. In the rotator 1700 of FIG. 17A, attachment arm 1701 is on the upward rotating side of the x-axis, such that it applies upward load to an attached load. Combdrives 1702 and 1703 are activated by two different and isolated electrodes, 1704 and 1705, respectively. In order to achieve downward motion of the attachment arm, combdrives 1702 and 1703 can be arranged on opposite sides to achieve opposite rotation. Another way to achieve downward motion of the attachment arm is to connect the attachment arm on the opposite side of the axis as is done in rotator 1710 of FIG. 17B.

Preferred embodiments of tip-tilt (two-axis) actuators utilize uni-directional balanced rotators described above in reference to FIG. 17. In an arrangement of actuators as in device 1300 and 1310, four such balanced rotators are used. Particularly, in device 1300, rotators A and B are of downward type (attachment arm to bi-axial linkage actuates downward) while their counterparts A' and B' are of upward type (attachment arm to bi-axial linkage actuates upward.) Electrically, actuators A and A' are connected together forming the electrical control for the x-axis, and actuators B and B' are connected together forming the electrical control for the y-axis. The mirror assembly, bi-axial linkages and the rest of the structure are connected to electrical ground. This is therefore a preferred embodiment because only 3 control signals are needed for full tip-tilt operation.

Yet another possible actuator is the bi-directional balanced rotator 1800 in FIG. 18A. This type of actuator achieves tip-piston degrees of freedom and is discussed in detail by V. Milanovic et al in "High Aspect Ratio Silicon Micromirrors with Large Static Rotation and Piston Actuation," *IEEE Photonics Technology Letters*, vol. 16(8), August 2004, pp. 1891-1893, which is incorporated herein by reference and will be summarized herein. Because the actuator utilizes four combdrives, two on each side of the rotation x-axis, various modes of actuation are possible. For example, by actuating combdrives 1801 and 1802, a balanced rotation is achieved, while balanced rotation in the opposite direction is achieved by activating combdrives 1803 and 1804. The combdrives are activated by applying a voltage difference between upper and lower sets of comb fingers, e.g., by applying a voltage V1 or V2 to combfingers connected to electrodes while the shuttle (and comb fingers connected to it) is held at GND. Pistoning down is achieved by activating 1802 and 1803, and pistoning up by activating 1801 and 1804. Various linear and nonlinear combinations of those modes are possible. In one possible realization of such an actuator (e.g., in device 1320 depicted in FIG. 13C) pairs of actuators are connected together by a block of conductive substrate, such that only balanced bi-directional rotations are possible. Namely, combdrives 1801 and 1802 are connected together, and combdrives 1803 and 1804 are connected to each other.

Bi-directional rotation may also achieved with the arrangement of balanced rotator 1810 depicted in FIG. 18B with both sides of the axis providing downward rotation when activated. This type of actuator is also discussed in detail by V. Milanovic et al in "High Aspect Ratio Silicon Micromirrors with Large Static Rotation and Piston Actuation," *IEEE Photonics Technology Letters*, vol. 16(8), August 2004, pp. 1891-1893, which has been incorporated herein by reference.

Figure 20A:
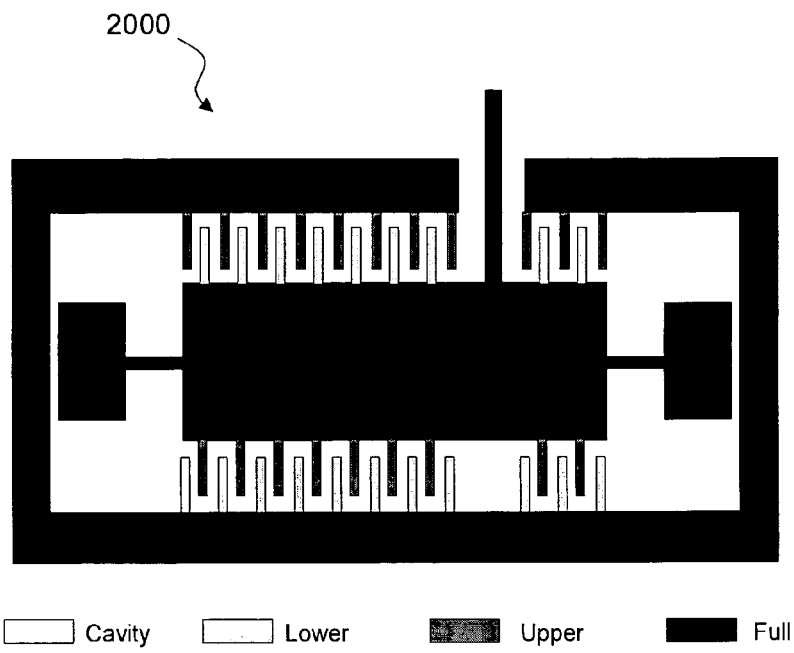
FIG. 20 shows a typical layout of a vertical combdrive balanced rotator in which the load-attachment arm connects to the rotator in a non-central position.

FIG. 20A is a plan view schematic of a preferred layout of a balanced rotator, in the case of device 2000, specifically a balanced rotator—upward (BR-U.) This type of actuator has the same intended functionality as actuator 1700, described previously. However, layout of actuator 2000 is different from the previously described actuator 1700 in the following way. In 1700, combdrives 1702 and 1703 are activated by two different and isolated electrodes, 1704 and 1705, respectively. In order to obtain balanced or pure rotation, actuation voltages to 1704 and 1705 should be substantially equal. Therefore, to minimize the required number of connections or wire bonds in the final device package, those electrodes can be directly connected in the layout of the device as is done in device 2000, forming one surrounding electrode 2001.

Figure 20B:
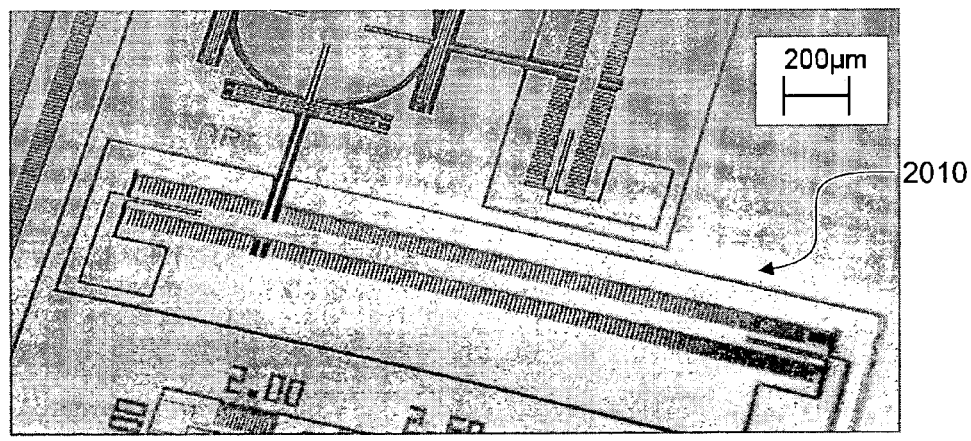

FIG. 20B is an SEM micrograph of actuator 2010, which is a demonstrated realization of the concept of actuator 2000 of FIG. 20A. In actuator 2010, an electrode 2011 surrounds the actuator and therefore provides actuation potential to all of the static combfingers in the actuator. Therefore, to actuate device 2010, and thereby force the bi-axial linkage 2014 upward, actuation voltage is applied to electrode 2011 with reference to a "ground" potential applied to either anchor 2012 or 2013. Those latter anchors are connected to the moving combfingers, the bi-axial linkage, as well as the micromirror directly as they are made of the same monolithic slab of silicon substrate.

In some preferred embodiments, such as e.g. actuator 2010, thin silicon tethers 2015 and 2016 are utilized to immobilize the parts of the actuator such as the shuttles of the combdrives, a device mount/micromirror, or the flexure beams that form part of the bi-axial linkages during the fabrication process to prevent possible breaking or crashing of the structure during wet processes or packaging. The tethers 2015, 2016 provide a temporary connection between the part being immobilized and adjacent supporting structures formed in the device layer. This effectively electrically shorts the structure as well preventing actuation of the combdrives. After final device assembly and packaging, these tethers must be removed by laser ablation, electrical current-melting, or another process. Such tethers are frequently used to immobilize the micromirror as well as it has a large surface and relatively large mass and can sometimes break away from the device structure during processing or packaging.

Figure 21A:
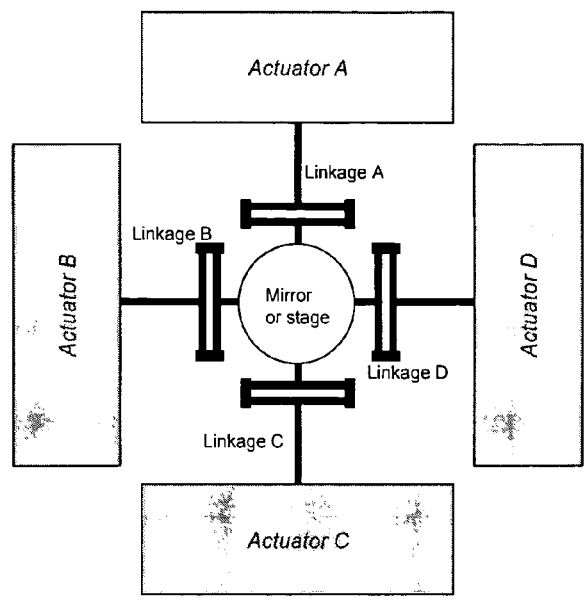
FIG. 21A and FIG. 21B are plan view schematics of possible layouts for tip-tilt and tip-tilt-piston devices with four actuators, four linkages and a micromirror or optical stage, according to embodiments of the invention.

FIG. 21A is a plan view of a tip-tilt-piston device layout that utilizes four actuators, four bi-axial linkages, and a central device mount. In this type of layout, each actuator may be of equal length and could be of any previously described actuator type. Also, in a possible embodiment of the invention, actuators A and C could be of substantially longer length than B and D, thereby providing substantially higher torque and possibly higher speed of actuation in one axis over another axis. Each of the four bi-axial linkages could be of any type described herein. Finally, the device mount may be a mirror in itself, or simply a mount on which a mirror can be bonded.

Figure 21B:
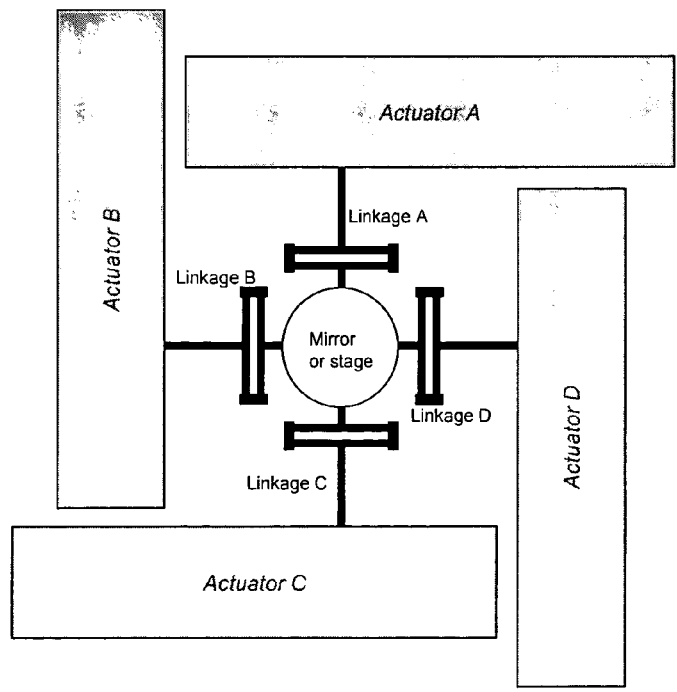

In preferred embodiments of high-speed tip-tilt actuators, it is desirable to extend the lengths of each actuator as long as possible (and allowed by the limitations of the chip size.) The actuators are arranged in such a pattern that one end of each rotator abuts a side of a neighboring rotator proximate the device mount and another end of each actuator may extend away from the device mount without abutting a neighboring rotator in the device. The layout arrangement in FIG. 21B is such an arrangement that nearly maximizes the capabilities of this invention as it allows each actuator to extend substantially beyond the limit in layout of FIG. 21A. By therefore increasing available torque for the actuator, all the support beams and the biaxial linkages can be designed substantially less compliant and therefore resonant frequencies are increased and in general device speed is increased.

Figure 22A:
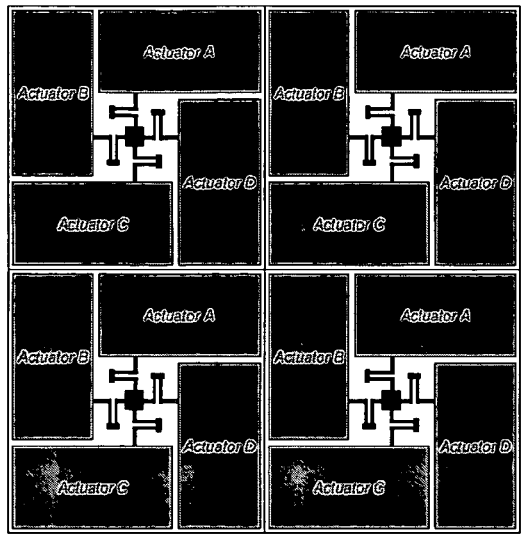
FIG. 22A is a plan view schematic of a possible layout of tip-tilt or tip-tilt-piston devices in such a way that they form an N by M array of scanners.
Figure 22B:
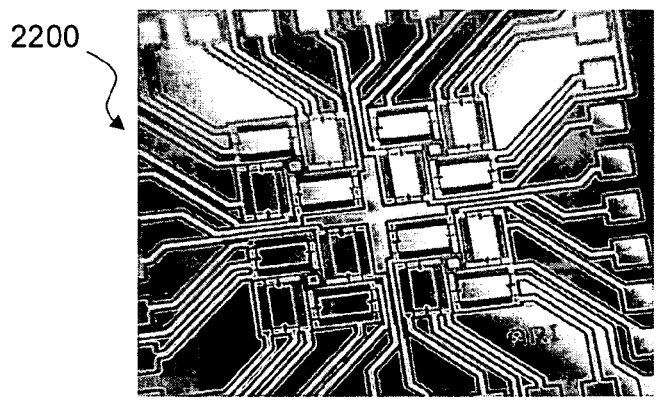
FIG. 22B is an SEM micrograph of a 2 by 2 element array of tip-tilt-piston devices according to an embodiment of the invention before micromirrors are bonded onto optical stages.
Figure 22C:
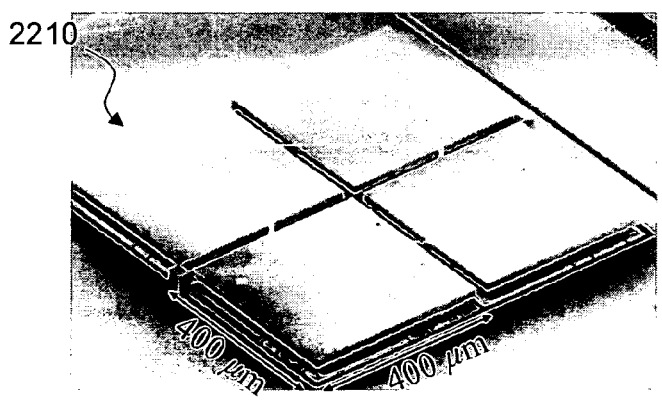
FIG. 22C is an SEM micrograph of a 2 by 2 element array of tip-tilt-piston devices according to an embodiment of the invention which has micromirrors bonded onto optical stages such that the actuators are fully hidden beneath to form high fill-factor arrays.

Various optical applications require large adaptive apertures with rapid reconfiguration rates. Even in the case of simple beam steering, increasing the mirror size results in significantly increased response times due to increased inertia. Therefore, it is desirable to replace large mirrors with phased arrays of smaller micromirrors. This offers several advantages such as significantly higher steering speeds and remarkably improved optical and mechanical properties. Past efforts have emphasized the need for such arrays but have not achieved all three degrees of freedom (3-DoF, tip-tilt-piston,) nor sufficiently high speeds of operation. Namely, if such 3-DoF device-phased arrays were available, it would enable more sophisticated optical beam shaping, multiple-beam steering, and a variety of general adaptive optics application. In FIG. 22B, four tip-tilt-piston actuators are arranged in a 2×2 array 2200 with minimal spacing between the actuators to achieve high fill-factor of the reflecting surfaces 2210 in FIG. 22C. Each actuator in FIG. 22B is rectangularly arranged in a layout that is schematically shown in FIG. 22A, with 500 µm on each side, and its central stage can be actuated to tip-tilt-piston, as will be discussed in more detail above. After transfer and bonding of separately fabricated single-crystal silicon mirrors (FIG. 22C,) the devices can be used independently, as four scanners, or together, as one larger (800×800 µm) aperture, etc.

Micromachined silicon micro-structures do not perform well as proper joints that are often used in large scale mechanisms. To obtain devices that perform the function of joints such as is needed in the implementation of the actuation methods described in this invention (e.g. FIG. 11,) mechanical flexures may be designed in such a way that they have a preferred axis of compliance, i.e. are substantially more compliant for bending or rotation in one direction, but are relatively stiff in other directions. Examples of several different of arranging flexure beams to from such a joint are illustrated in FIGS. 23A-23G.

FIG. 23A is a 3D schematic of a monolithic piece of silicon substrate which is micromachined in such a way that it forms a 1 DoF (one-axis) linkage 2300. The linkage 2300 has non-compliant beams 2302 and 2303 (large dimensions,) and compliant flexure beams 2301 (narrow dimensions) which have a preferred compliance in torsion. Therefore this linkage can be bent around the x-axis with substantially less force than in any other directions and can serve as a 1 DoF "joint."

FIG. 23B-FIG. 23G are plan view diagrams of various possible arrangements of stiff and compliant beams to achieve the above mentioned one-axis "joint" effect. In FIG. 23B, the one-axis linkage 2310 has two torsionally compliant flexure beam elements 2311 and 2312. Because they are arranged in parallel in this layout, and have same dimensions, the overall stiffness in the desired axis rotation of linkage 2310 is twice the stiffness of element 2311.

Linkage 2320 in FIG. 23C has two flexure beam elements connected in series and therefore, the overall stiffness in the desired axis rotation of linkage 2310 is one half the stiffness of one element.

Linkage 2330 in FIG. 23D has two flexure beam elements connected in series which are in parallel with another pair of elements which are in series. It is nearly equivalent to two linkages 2310 in series. Therefore, the overall stiffness in the desired axis rotation of linkage 2330 is the stiffness of one element.

Linkage 2340 in FIG. 23E has four flexure beam elements connected in series and therefore, the overall stiffness in the desired axis rotation of linkage 2340 is one quarter of the stiffness of one element.

Linkage 2350 in FIG. 23F is nearly equivalent to four linkages 2310 in series, and therefore the overall stiffness in the desired axis rotation of linkage 2350 is ½* stiffness of one element.

Linkage 2360 in FIG. 23G has two elements connected in series, which are in parallel with another pair of elements which are in series. It is nearly equivalent to two linkages 2310 in series. This is the plan view schematic of the linkage 2300. Therefore, the overall stiffness in the desired axis rotation of linkage 2330 is the stiffness of one flexure beam element.

Linkage 2330 utilizes a central stiff beam support 2332 unlike similar linkage 2360. In the desired mode of x-axis rotation both linkages perform substantially equally. However, linkage 2330 is substantially less compliant to any axial forces, which tend to "squeeze" the joint together or pull the joint apart. Linkages 2320, 2340, 2350, 2360 are not designed for axial stiffness but allow stretching of the linkage on axis of the stiff elements 2302 and 2303.

The tip-tilt and tip-tilt-piston actuators of the present invention, where 1 DoF rotators are used to actuate a central device mount in two-axis, require a more complex linkage than the simple 1 DoF loops and buckles described earlier. Namely, to take 1 DoF rotation from the rotators, but allow 2 DoF (tip-tilt) or 3 DoF (tip-tilt-piston) of the central device mount, the linkage need to be a 2 DoF minimum linkage (at least bi-axial.) This only applies to desired degrees of freedom, i.e. the purposefully designed compliances in the linkage. Clearly, any linkages designed in the micromachined silicon structures will have many other degrees of freedom of significantly higher order and resonant frequency that we can consider them as substantially stiff and negligible in the present discussion and nominal device operation.

Figure 24A:
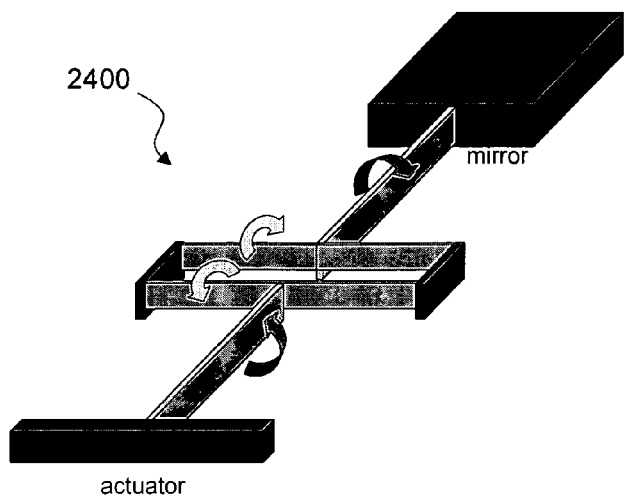
FIG. 24 and FIG. 25 is a series of 3D schematics of various 2 DoF linkages that can be micromachined from a single monolithic piece of substrate.

FIG. 24A illustrates one preferred embodiment 2400 of the bi-axial (2 DoF) linkage in the present invention. All the beams are placed substantially equal to the uni-axial (1 DoF) linkage 2300. Therefore rotation of the linkage about the x-axis is provided by the torsional compliance of the beams 2403 and 2404. In addition, to enable rotation of the actuator or the mirror about the y-axis, either one or both beams 2401 and 2402 are designed to be torsionally compliant.

Figure 24B:
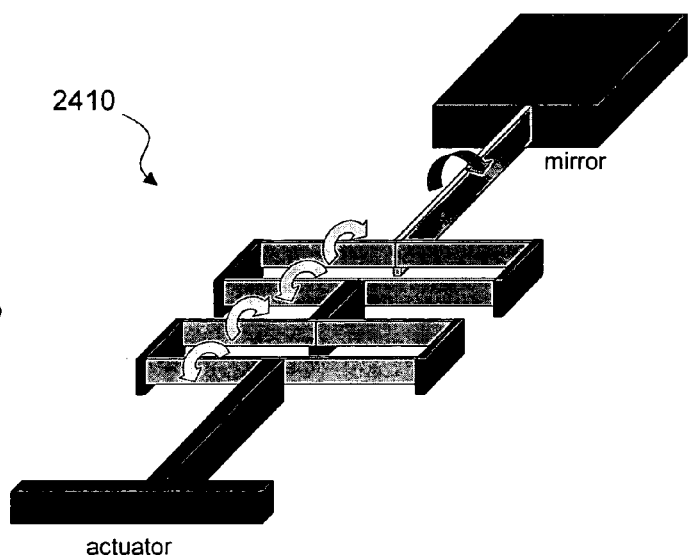

Bi-axial linkage 2410 in FIG. 24B employs series arrangement of x-axis beams shown in linkage 2350 of FIG. 23F. In addition, y-axis beam 2311 is designed to be compliant for torsion about the y-axis giving the overall bi-axial compliance in two orthogonal axes. If we hold the actuator end of the linkage and prevent it from moving, we can apply tip-tilt-piston 3 DoF of motion to the mirror end to a substantially large degree without breaking the linkage. In addition, upon removing the force on the mirror, it will restore into original position due to the beams restoring force.

Any beam arrangements that provide for the 2 DoF in the mirror and transfer the rotator's rotation to the parallel axis in the mirror can be used. In certain embodiments of the invention described herein an important feature is a bi-axial linkage having two flexure beams, each configured to flex about a different (non parallel) axis. The restriction is to try to design the linkage so as to minimize any other compliances to modes that are undesired, which basically result in mirrors in-plane (lateral) movement, or mirrors vertical translation (when piston mode is not desired.) For tip-tilt embodiments of the invention, any mode that does not result in rotation of the mirror about it's gravity center are undesired and should be avoided by proper linkage design—and by utilizing opposing rotators on the other side, as depicted in the complete gimbal-less actuators 1300, 1310, and 1320.

Figure 25A:
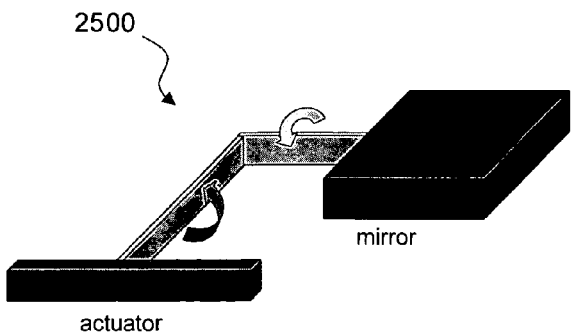

FIG. 25A shows a 3D schematic diagram of one more possible embodiment of the bi-axial linkages of the present invention. Linkage 2500 of FIG. 25A utilizes a simple L-shaped arrangement of torsionally compliant beams 2501 and 2502 such that beam 2501 allows mirror's rotation about the x-axis while beam 2502 allows rotation about the mirror's y-axis.

Figure 25B:
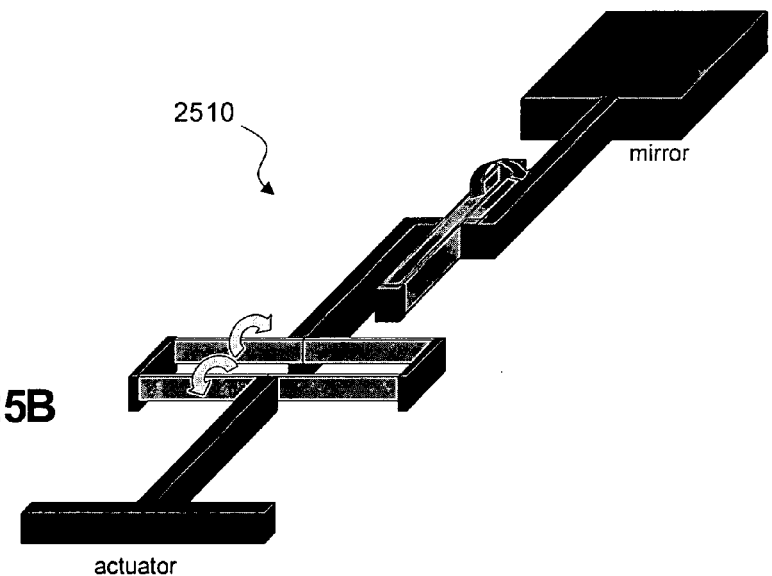

FIG. 25B shows a 3D schematic diagram of yet another possible embodiment of the bi-axial linkages of the present invention. Linkage 2510 of FIG. 25B utilizes two uni-axial (1 DoF) linkages 2300 from FIG. 23A which are placed orthogonally to each other to allow mirror's rotation about the x-axis or the y-axis.

Numerous modifications and variations of the present invention are possible in light of the above teachings. It is therefore to be understood that within the scope of the appended claims, the invention may be practiced otherwise than as specifically described herein.

Some of the advantages realized in some but not necessarily all embodiments include:

High fill factor linear arrays. Fill factors as high as 99% may be achieved in some embodiments along one dimension;

Almost negligible cross-coupling between two tilt axes;

Both axes can actuate at very high speed, or can be designed to have arbitrary ratios of resonant frequencies.

Inexpensive and simple control. Even an open loop/look up table control is a possibility;

Simple fabrication process can be used to fabricate the device; and

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

We claim:

1. A micro-electro-mechanical-system (MEMS) device, comprising:
   a first rotational actuator having a first rotation axis;
   a second rotational actuator having a second rotation axis, wherein the first and second rotation axes are non-parallel;
   a device mount;
   a first bi-axial linkage coupled between the device mount and the first rotational actuator without an intervening frame, wherein the first biaxial linkage includes a first flexure beam configured to flex about a first flexure axis and a second flexure beam configured to flex about a second flexure axis that is non-parallel to the first flexure axis; and
   a second bi-axial linkage coupled between the device mount and the second rotational actuator without an intervening frame, wherein the second biaxial linkage includes a third flexure beam configured to flex about a third flexure axis and a fourth flexure beam configured to flex about a fourth flexure axis that is non-parallel to the third flexure axis, wherein the first and second bi-axial linkages provide the device mount with two or more degrees of freedom of movement, wherein the first and second bi-axial linkages and device mount are formed from the same device layer.

2. A device according to claim 1, further comprising an optical component attached to or integral to the device mount.

3. A device according to claim 2 wherein the optical component is a mirror.

4. A device according to claim 1 wherein the first axis is substantially perpendicular to the second axis.

5. A device according to claim 1 wherein the bi-axial linkages and actuators are configured to provide tip-tilt or tip-tilt-piston motion to the device mount.

6. A device according to claim 1 wherein the actuators are balanced rotators comprised of opposing down-force and up-force vertical combdrives on either side of a rotating axis.

7. A device according to claim 1 wherein the actuators are un-balanced uni-directional rotators comprised of either a down-force or an up-force vertical combdrive on either side or on both sides of a rotating axis.

8. A device according to claim 1 further comprising a mirror attached to the device mount, wherein the mirror is sized to partially or completely cover the actuators.

9. A device according to claim 1 wherein the device layer is attached directly to a substrate containing control circuitry for the device.

10. A device according to claim 1 wherein the device layer is attached to a handle substrate and the handle substrate is attached to a substrate containing control circuitry for the device.

11. A device according to claim 1 wherein, the device mount, one or more of the actuators, or one or more of the first and second flexure beams is connected to a structural support by one or more tethers.

12. A plurality N×M of devices according to claim 1 arranged in N rows of M devices thereby forming an N×M MEMS array, where $N \geq 1$ and $M \geq 2$.

13. A micro-electro-mechanical-system (MEMS) device, comprising: a device mount supported by two or more linkages with each linkage mechanically coupled between the device mount and a different one of two or more actuators, wherein the two or more linkages provide the device mount with two or more degrees of freedom of movement, wherein the linkages, the actuators and the device mount are formed from the same layer of material, wherein the actuators are balanced rotators comprised of opposing down-force and up-force vertical combdrives on either side of an axis of rotation of the actuator, respectively, wherein the down-force and up-force vertical combdrives are formed from the same layer of material as the device mount and the linkages.

14. A micro-electro-mechanical-system (MEMS) device, comprising: a gimbal-less device mount supported by two or more linkages with each linkage mechanically coupled between the device mount and an actuator, wherein the two or more linkages provide the device mount with two or more degrees of freedom of movement, wherein three or more actuators are arranged in such a pattern that one end of each actuator abuts a side of a neighboring actuator proximate the device mount and each actuator may extend away from the device mount along a direction parallel to an axis of rotation provided by the actuator without abutting a side of a neighboring actuator in the device.

* * * * *